US011889199B2

United States Patent
Miyatani

(10) Patent No.: US 11,889,199 B2
(45) Date of Patent: Jan. 30, 2024

(54) IMAGING DEVICE, SIGNAL PROCESSING DEVICE, SIGNAL PROCESSING METHOD, PROGRAM, AND IMAGING APPARATUS

(71) Applicant: Sony Group Corporation, Tokyo (JP)

(72) Inventor: Yoshitaka Miyatani, Tokyo (JP)

(73) Assignee: Sony Group Corporation, Tokyo (JP)

( * ) Notice: Subject to any disclaimer, the term of this patent is extended or adjusted under 35 U.S.C. 154(b) by 246 days.

(21) Appl. No.: 17/612,043

(22) PCT Filed: May 21, 2020

(86) PCT No.: PCT/JP2020/020061
§ 371 (c)(1),
(2) Date: Nov. 17, 2021

(87) PCT Pub. No.: WO2020/246250
PCT Pub. Date: Dec. 10, 2020

(65) Prior Publication Data
US 2022/0232157 A1    Jul. 21, 2022

(30) Foreign Application Priority Data
Jun. 4, 2019   (JP) ................................ 2019-104236

(51) Int. Cl.
*H04N 23/745*   (2023.01)
*G06V 10/60*   (2022.01)
(Continued)

(52) U.S. Cl.
CPC .......... *H04N 23/745* (2023.01); *G06T 5/001* (2013.01); *G06T 5/50* (2013.01); *G06T 7/20* (2013.01);
(Continued)

(58) Field of Classification Search
CPC .. G06T 5/50; G06T 5/001; G06T 7/20; G06T 2207/20212; H04N 23/745; H04N 25/778;
(Continued)

(56) References Cited

U.S. PATENT DOCUMENTS

| 7,142,234 B2 * | 11/2006 | Kaplinsky | .............. H04N 23/70 348/E5.037 |
| 8,441,551 B2 * | 5/2013 | Greenland | .......... H04N 25/531 348/364 |

(Continued)

FOREIGN PATENT DOCUMENTS

| JP | 2003-32551 A | 1/2003 |
| WO | 2018/012492 A1 | 1/2018 |

(Continued)

OTHER PUBLICATIONS

International Search Report (PCT/ISA/210), International Application No. PCT/JP2020/020061, dated Jul. 31, 2020.

*Primary Examiner* — Pritham D Prabhakher
(74) *Attorney, Agent, or Firm* — Michael Best & Friedrich LLP

(57) ABSTRACT

The present technology relates to an imaging device, a signal processing device, a signal processing method, a program, and an imaging apparatus that are designed to reduce flicker in the imaging apparatus that does not use any imaging lens. The imaging device includes: a pixel region in which a plurality of pixels including a pixel that receives incident light and outputs one detection signal indicating an output pixel value modulated depending on the incident angle of the incident light is arranged in a row direction and a column direction, and is sequentially exposed row by row, the incident light entering from an object via neither an imaging lens nor a pinhole; and a plurality of detection regions that are disposed in different rows in the pixel region, and are (Continued)

used for flicker detection. The present technology can be applied to an imaging apparatus, for example.

18 Claims, 25 Drawing Sheets

(51) Int. Cl.
*G06T 5/00* (2006.01)
*G06T 5/50* (2006.01)
*G06T 7/20* (2017.01)
*H01L 27/146* (2006.01)

(52) U.S. Cl.
CPC .... *G06V 10/60* (2022.01); *G06T 2207/20212* (2013.01); *H01L 27/1464* (2013.01); *H01L 27/14621* (2013.01); *H01L 27/14623* (2013.01); *H01L 27/14627* (2013.01); *H01L 27/14636* (2013.01); *H01L 27/14645* (2013.01)

(58) Field of Classification Search
CPC ......... H01L 27/14625; H01L 27/14609; H01L 27/14623; H01L 27/14636; H01L 27/14621; H01L 27/14627; H01L 27/14645; H01L 27/1464; G06V 10/60
USPC ...................................................... 348/226.1
See application file for complete search history.

(56) References Cited

U.S. PATENT DOCUMENTS

| | | | |
|---|---|---|---|
| 8,530,811 B2* | 9/2013 | Molnar | H01L 27/1446 |
| | | | 250/237 G |
| 10,161,788 B2* | 12/2018 | Stork | G02B 5/1871 |
| 10,274,652 B2* | 4/2019 | Endsley | H04N 25/00 |
| 10,990,663 B2* | 4/2021 | Facon | H04L 9/0866 |
| 2004/0109069 A1 | 6/2004 | Kaplinsky | |
| 2009/0095912 A1* | 4/2009 | Slinger | H04N 25/00 |
| | | | 250/363.06 |
| 2010/0097514 A1* | 4/2010 | McCarten | H01L 27/14634 |
| | | | 348/E5.022 |
| 2011/0074942 A1* | 3/2011 | Endo | A61B 1/00186 |
| | | | 348/E7.085 |
| 2014/0368618 A1* | 12/2014 | Ushinaga | H01L 27/14623 |
| | | | 348/49 |
| 2015/0293018 A1* | 10/2015 | Stork | G02B 5/1871 |
| | | | 250/550 |
| 2017/0230575 A1* | 8/2017 | Endsley | G02B 5/1842 |
| 2018/0047766 A1* | 2/2018 | Pyo | H01L 27/1463 |
| 2019/0121955 A1* | 4/2019 | Facon | G06F 21/45 |
| 2019/0123916 A1* | 4/2019 | Facon | H04L 9/3278 |

FOREIGN PATENT DOCUMENTS

| | | |
|---|---|---|
| WO | 2019/078340 A1 | 4/2019 |
| WO | WO-2019078333 A1 | 4/2019 |

* cited by examiner

IMAGING DEVICE, SIGNAL PROCESSING DEVICE, SIGNAL PROCESSING METHOD, PROGRAM, AND IMAGING APPARATUS

TECHNICAL FIELD

The present technology relates to an imaging device, a signal processing device, a signal processing method, a program, and an imaging apparatus, and more particularly, to an imaging device, a signal processing device, a signal processing method, a program, and an imaging apparatus that are designed to reduce flicker in the imaging apparatus that does not use any imaging lens.

BACKGROUND ART

There has been a suggested imaging apparatus that captures an image without the use of an imaging lens by modulating light from the object with a light shielding film covering the light receiving surface of each pixel of an imaging device, and restores a restored image in which an image of the object is formed by a predetermined arithmetic process (see Patent Document 1, for example).

CITATION LIST

Patent Document

Patent Document 1: WO 2018/012492 A

SUMMARY OF THE INVENTION

Problems to be Solved by the Invention

Meanwhile, there has been a demand for reduced flicker in an imaging apparatus that does not use any imaging lens as disclosed in Patent Document 1.

The present technology has been made in view of such circumstances, and is to reduce flicker in an imaging apparatus that does not use any imaging lens.

Solution to Problems

An imaging device of a first aspect of the present technology includes: a pixel region in which a plurality of pixels including a pixel that receives incident light and outputs a detection signal indicating an output pixel value modulated depending on the incident angle of the incident light is arranged in a row direction and a column direction, and is sequentially exposed row by row, the incident light entering from an object via neither an imaging lens nor a pinhole; and a plurality of detection regions that are disposed in different rows in the pixel region, and are used for flicker detection.

A signal processing device of a second aspect of the present technology includes a flicker detection unit that performs flicker detection on the basis of at least either a plurality of detection images or a plurality of restored images restored from the respective detection images, the plurality of detection images being generated for a plurality of detection regions on the basis of detection signals output from pixels in the plurality of detection regions disposed in different rows in a pixel region that is sequentially exposed row by row, a plurality of pixels being arranged in a row direction and a column direction in the pixel region, the plurality of pixels including a pixel that receives incident light and outputs a detection signal indicating an output pixel value modulated depending on an incident angle of the incident light, the incident light entering from an object via neither an imaging lens nor a pinhole.

A signal processing method of the second aspect of the present technology includes performing flicker detection on the basis of at least either a plurality of detection images or a plurality of restored images restored from the respective detection images, the plurality of detection images being generated for a plurality of detection regions on the basis of detection signals output from pixels in the plurality of detection regions disposed in different rows in a pixel region that is sequentially exposed row by row, a plurality of pixels being arranged in a row direction and a column direction in the pixel region, the plurality of pixels including a pixel that receives incident light and outputs a detection signal indicating an output pixel value modulated depending on an incident angle of the incident light, the incident light entering from an object via neither an imaging lens nor a pinhole.

A program of the second aspect of the present technology causes a computer to perform a process including performing flicker detection on the basis of at least either a plurality of detection images or a plurality of restored images restored from the respective detection images, the plurality of detection images being generated for a plurality of detection regions on the basis of detection signals output from pixels in the plurality of detection regions disposed in different rows in a pixel region that is sequentially exposed row by row, a plurality of pixels being arranged in a row direction and a column direction in the pixel region, the plurality of pixels including a pixel that receives incident light and outputs a detection signal indicating an output pixel value modulated depending on an incident angle of the incident light, the incident light entering from an object via neither an imaging lens nor a pinhole.

An imaging apparatus of a third aspect of the present technology includes: an imaging device that includes: a pixel region that is sequentially exposed row by row, a plurality of pixels being arranged in a row direction and a column direction in the pixel region, the plurality of pixels including a pixel that receives incident light and outputs a detection signal indicating an output pixel value modulated depending on an incident angle of the incident light, the incident light entering from an object via neither an imaging lens nor a pinhole; and a plurality of detection regions that are disposed in different rows in the pixel region, and are used for flicker detection; and a flicker detection unit that performs flicker detection on the basis of at least one of a plurality of detection images or a plurality of restored images restored from the respective detection images, the plurality of detection images being generated for the plurality of detection regions on the basis of detection signals output from the pixels in the respective detection regions.

The first aspect of the present technology provides: a pixel region in which a plurality of pixels including a pixel that receives incident light and outputs a detection signal indicating an output pixel value modulated depending on the incident angle of the incident light is arranged in a row direction and a column direction, and is sequentially exposed row by row, the incident light entering from an object via neither an imaging lens nor a pinhole; and a plurality of detection regions that are disposed in different rows in the pixel region, and are used for flicker detection.

In the second aspect of the present technology, flicker detection is performed on the basis of at least either a plurality of detection images or a plurality of restored images restored from the respective detection images, the plurality of detection images being generated for a plurality of detection regions on the basis of detection signals output from pixels in the plurality of detection regions disposed in different rows in a pixel region that is sequentially exposed row by row, a plurality of pixels being arranged in a row direction and a column direction in the pixel region, the plurality of pixels including a pixel that receives incident light and outputs a detection signal indicating an output pixel value modulated depending on an incident angle of the incident light, the incident light entering from an object via neither an imaging lens nor a pinhole.

In the third aspect of the present technology, flicker detection is performed on the basis of at least either a plurality of detection images or a plurality of restored images restored from the respective detection images, the plurality of detection images being generated for the respective detection regions in a plurality of detection regions on the basis of detection signals output from pixels in the respective detection regions of an imaging device that includes a pixel region and the plurality of detection regions to be used for flicker detection, the pixel region being sequentially exposed row by row, a plurality of pixels being arranged in a row direction and a column direction in the pixel region, the plurality of pixels including a pixel that receives incident light and outputs a detection signal indicating an output pixel value modulated depending on the incident angle of the incident light, the incident light entering from an object via neither an imaging lens nor a pinhole.

BRIEF DESCRIPTION OF DRAWINGS

FIG. 15 is a diagram for explaining a flicker reducing effect to be achieved by dividing a pixel region.

MODE FOR CARRYING OUT THE INVENTION

Figure 1:
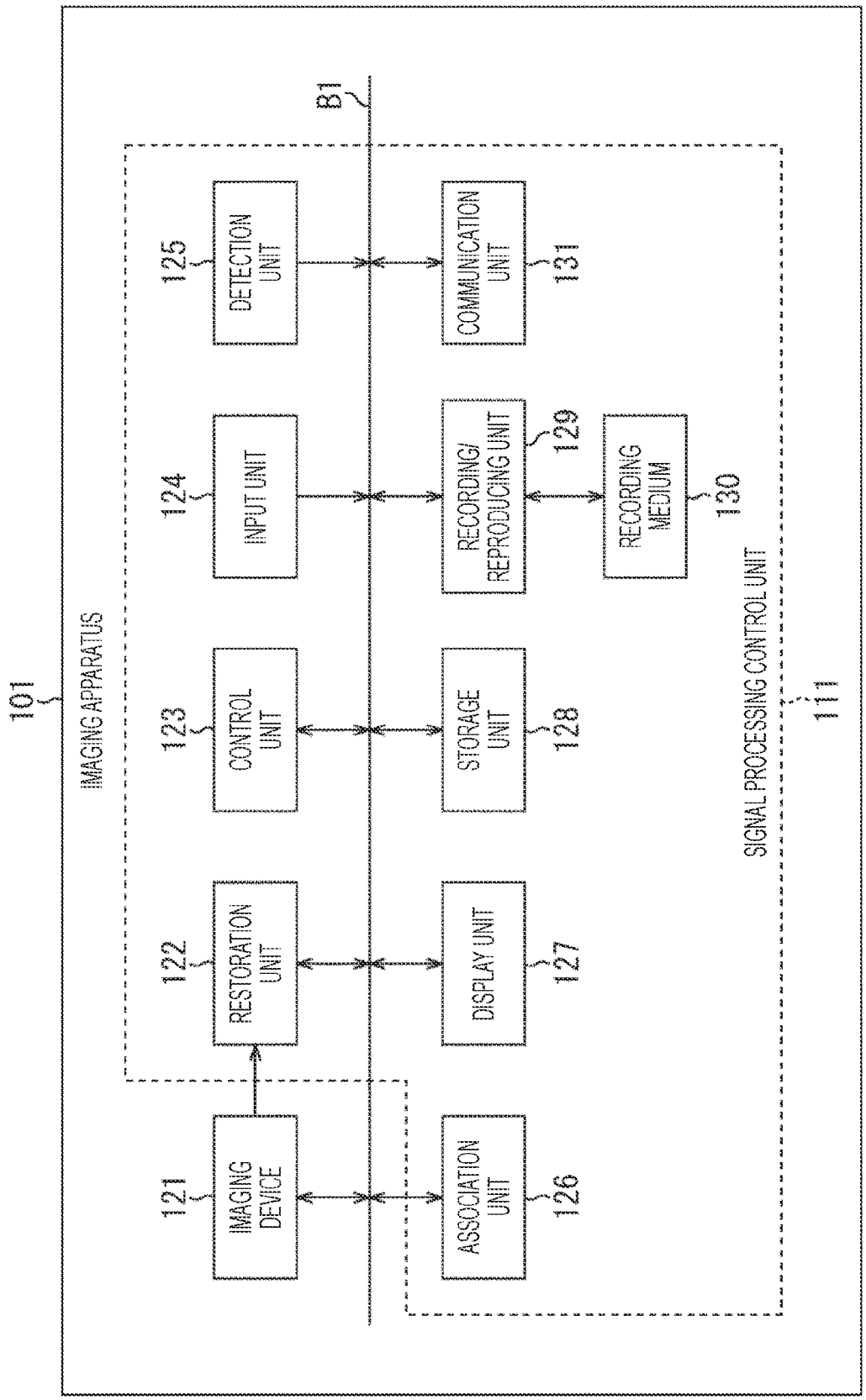
FIG. 1 is a block diagram showing an example configuration of an imaging apparatus to which the present technology is applied.

The following is a detailed description of preferred embodiments of the present technology, with reference to the accompanying drawings. Note that, in this specification and the drawings, components having substantially the same functional configurations are denoted by the same reference numerals, and repeated explanation of them will not be made.

Further, explanation will be made in the following order.
1. Embodiment
2. Modifications
3. Example applications
4. Other aspects
<<1. Embodiment>>

An embodiment of the present technology is described, with reference to FIGS. 1 to 18.

<Example Configuration of an Imaging Apparatus 101>

FIG. 1 is a block diagram showing an example configuration of an imaging apparatus 101 to which the present technology is applied.

The imaging apparatus 101 includes an imaging device 121, a restoration unit 122, a control unit 123, an input unit 124, a detection unit 125, an association unit 126, a display unit 127, a storage unit 128, a recording/reproducing unit 129, a recording medium 130, and a communication unit 131. Also, the restoration unit 122, the control unit 123, the input unit 124, the detection unit 125, the association unit 126, the display unit 127, the storage unit 128, the recording/reproducing uni 129, the recording medium 130, and the communication unit 131 constitute a signal processing control unit 111 that performs signal processing, control on the imaging apparatus 101, and the like. Note that the imaging apparatus 101 does not include any imaging lens (free of imaging lenses).

Further, the imaging device 121, the restoration unit 122, the control unit 123, the input unit 124, the detection unit 125, the association unit 126, the display unit 127, the storage unit 128, the recording/reproducing unit 129, and the communication unit 131 are connected to one another via a bus B1, and perform data transmission/reception and the like via the bus B1. Note that, in the description below, the bus B1 in a case where each component of the imaging apparatus 101 performs data transmission, reception and the like via the bus B1 will not be mentioned, for ease of explanation. For example, a case where the input unit 124 supplies data to the control unit 123 via the bus B1 will be described as a case where the input unit 124 supplies data to the control unit 123.

The imaging device 121 is an imaging device in which the detection sensitivity of each pixel has an incident angle directivity, and outputs an image including a detection signal indicating a detection signal level corresponding to the amount of incident light, to the restoration unit 122 or the bus B1. The detection sensitivity of each pixel having an incident angle directivity means that the light-receiving sensitivity characteristics corresponding to the incident angle of incident light entering each pixel vary with each pixel. However, the light-receiving sensitivity characteristics of all the pixels are not necessarily completely different, and the light-receiving sensitivity characteristics of some pixels may be the same.

More specifically, the imaging device 121 may have a basic structure similar to that of a general imaging device such as a complementary metal oxide semiconductor (CMOS) image sensor, for example. However, the configuration of each of the pixels constituting the pixel array unit of the imaging device 121 differs from that of a general imaging device, and is a configuration that has an incident angle directivity, as will be described later with reference to FIGS. 3 to 5, for example. Further, the imaging device 121 has light-receiving sensitivity that varies (changes) with the incident angle of incident light in each pixel, and has an incident angle directivity with respect to the incident angle of incident light in each pixel.

Figure 2:
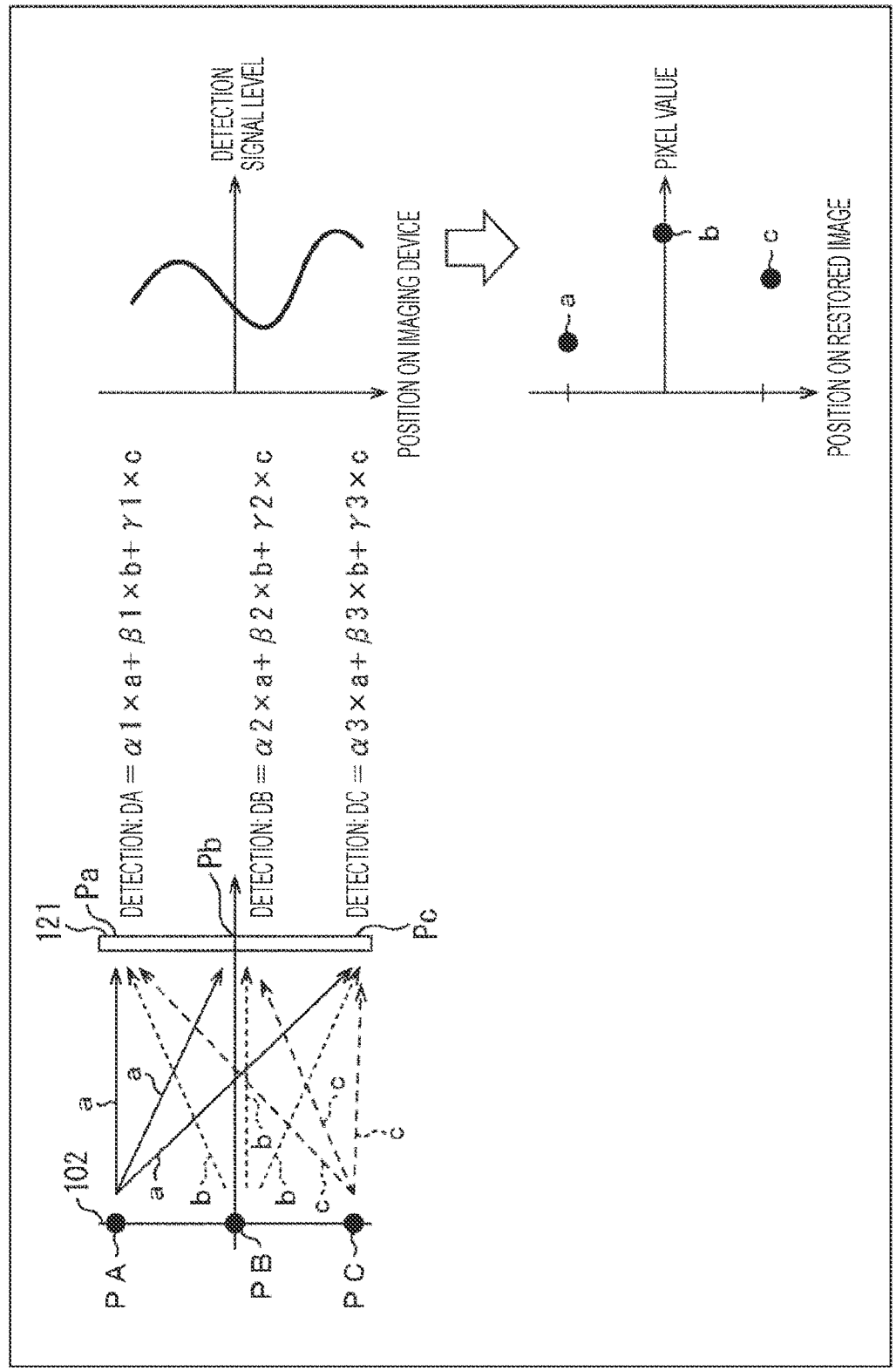
FIG. 2 is a diagram for explaining the principles of imaging in the imaging apparatus to which the present technology is applied.

Here, all objects are a set of point light sources, for example, and light is emitted from each point light source in all directions. For example, an object surface 102 of an object in the top left of FIG. 2 is formed with point light sources PA to PC, and the point light sources PA to PC emit a plurality of light beams of light intensities a to c, respectively, to the surroundings. Further, in the description below, the imaging device 121 includes pixels (hereinafter referred to as pixels Pa to Pc) having different incident angle directivities at positions Pa to Pc.

In this case, as shown in the top left of FIG. 2, light beams of the same light intensity emitted from the same point light source are made to enter the respective pixels of the imaging device 121. For example, a light beam of the light intensity a emitted from the point light source PA is made to enter the respective pixels Pa to Pc of the imaging device 121. However, light beams emitted from the same point light source are made to enter the respective pixels at different incident angles. For example, light beams from the point light source PA are made to enter the respective pixels Pa to Pc at different incident angles.

On the other hand, since the incident angle directivities of the pixels Pa to Pc differ from one another, light beams of the same light intensity emitted from the same point light source are detected with different sensitivities in the respective pixels. As a result, light beams of the same light intensity are detected at different detection signal levels in the respective pixels. For example, the detection signal levels with respect to the light beams of the light intensity a from the point light source PA have different values in the respective pixels Pa to Pc.

Further, the light-receiving sensitivity level of each pixel with respect to a light beam from each point light source is determined by multiplying the light intensity of the light beam by a coefficient indicating the light-receiving sensitivity (which is the incident angle directivity) with respect to the incident angle of the light beam. For example, the detection signal level of the pixel Pa with respect to the light beam from the point light source PA is determined by multiplying the light intensity a of the light beam of the point light source PA by a coefficient indicating the incident angle directivity of the pixel Pa with respect to the incident angle of the light beam entering the pixel Pa.

Accordingly, the detection signal levels DA, DB, and DC of the pixels Pc, Pb, and Pa are expressed by Equations (1) to (3) shown below, respectively.

$$DA = \alpha 1 \times a + \beta 1 \times b + \gamma 1 \times c \quad (1)$$

$$DB = \alpha 2 \times a + \beta 2 \times b + \gamma 2 \times c \quad (2)$$

$$DC = \alpha 3 \times a + \beta 3 \times b + \gamma 3 \times c \quad (3)$$

Here, the coefficient $\alpha 1$ is a coefficient indicating the incident angle directivity of the pixel Pc with respect to the incident angle of the light beam from the point light source PA to the pixel Pc, and is set in accordance with the incident angle. Further, $\alpha 1 \times a$ indicates the detection signal level of the pixel Pc, with respect to the light beam from the point light source PA.

The coefficient $\beta 1$ is a coefficient indicating the incident angle directivity of the pixel Pc with respect to the incident angle of the light beam from the point light source PB to the pixel Pc, and is set in accordance with the incident angle. Further, $\beta 1 \times b$ indicates the detection signal level of the pixel Pc with respect to the light beam from the point light source PB.

The coefficient $\gamma 1$ is a coefficient indicating the incident angle directivity of the pixel Pc with respect to the incident angle of the light beam from the point light source PC to the pixel Pc, and is set in accordance with the incident angle. Further, $\gamma 1 \times c$ indicates the detection signal level of the pixel Pc with respect to the light beam from the point light source PC.

As described above, the detection signal level DA of the pixel Pa is determined by the sum of products of the respective light intensities a, b, and c of the light beams from the point light sources PA, PB, and PC in the pixel Pc, and the coefficients $\alpha 1$, $\beta 1$, and $\gamma 1$ indicating the incident angle directivities depending on the respective incident angles.

Likewise, the detection signal level DB of the pixel Pb is determined by the sum of products of the respective light intensities a, b, and c of the light beams from the point light sources PA, PB, and PC in the pixel Pb, and the coefficients $\alpha 2$, $\beta 2$, and $\gamma 2$ indicating the incident angle directivities depending on the respective incident angles, as shown in Equation (2). Also, the detection signal level DC of the pixel Pc is determined by the sum of products of the respective light intensities a, b, and c of the light beams from the point light sources PA, PB, and PC in the pixel Pa, and the coefficients $\alpha 2$, $\beta 2$, and $\gamma 2$ indicating the incident angle directivities depending on the respective incident angles, as shown in Equation (3).

However, the detection signal levels DA, DB, and DC of the pixels Pa, Ph, and Pc are mixed with the light intensities a, b, and c of the light beams emitted from the point light sources PA, PB, and PC, respectively, as shown in Equations (1) to (3). Therefore, as shown in the top right of FIG. 2, the detection signal level in the imaging device 121 differs from the light intensity of each point light source on the object surface 102. Accordingly, an image obtained by the imaging device 121 differs from that in which an image of the object surface 102 is formed.

Meanwhile, the light intensities a to c of the light beams of the respective point light sources PA to PC are determined by creating simultaneous equations formed with Equations (1) to (3) and solving the created simultaneous equations. The pixels having the pixel values corresponding to the obtained light intensities a to c are then arranged in accordance with the layout (relative positions) of the point light sources PA to PC, so that a restored image in which an image of the object surface 102 is formed is restored as shown in the bottom right of FIG. 2.

In this manner, the imaging device 121 that has an incident angle directivity in each pixel without requiring any imaging lens and any pinhole can be obtained.

In the description below, a set of coefficients (the coefficients $\alpha 1$, $\beta 1$, and $\gamma 1$, for example) for each of the equations forming the simultaneous equations will be referred to as a coefficient set. In the description below, a group formed with a plurality of coefficient sets (the coefficient set of $\alpha 1l$, $\beta 1$, and $\gamma 1$, the coefficient set of $\alpha 2$, $\beta 2$, and $\gamma 2$, the coefficient set of $\alpha 3$, $\beta 3$, and $\gamma 3$, for example) corresponding to a plurality of equations included in the simultaneous equations will be referred to as a coefficient set group.

Here, if the object distance from the object surface 102 to the light receiving surface of the imaging device 121 varies, the incident angles of the light beams from the respective point light sources on the object surface 102 to the imaging device 121 vary, and therefore, a different coefficient set group is required for each object distance.

Therefore, in the imaging apparatus 101, coefficient set groups for the respective distances (object distances) from the imaging device 121 to the object surface are prepared in advance, simultaneous equations are created by switching the coefficient set groups for each object distance, and the created simultaneous equations are solved. Thus, restored images of the object surface at various object distances can be obtained on the basis of one detection image. For example, after a detection image is captured and recorded once, the coefficient set groups are switched in accordance with the distance to the object surface, and a restored image is restored, so that a restored image of the object surface at a desired object distance can be generated.

Further, even on the object surface 102 at the same object distance, if the number and the layout of the point light sources to be set vary, the incident angles of the light beams from the respective point light sources to the imaging device 121 also vary. Therefore, a plurality of coefficient set groups might be required for the object surface 102 at the same object distance in some cases. Furthermore, the incident angle directivity of each pixel 121a needs to be set so that the independence of the simultaneous equations described above can be ensured.

Further, an image to be output by the imaging device 121 is an image formed with detection signals in which an image of the object is not formed as shown in the top right of FIG. 2, and therefore, the object cannot be visually recognized. That is, a detection image formed with detection signals output from the imaging device 121 is a set of pixel signals, but also is an image from which the user cannot visually recognize the object (the object is visually unrecognizable).

In view of this, an image formed with detection signals in which an image of the object is not formed as shown in the top right of FIG. 2, or an image captured by the imaging device 121, will be hereinafter referred to as a detection image.

Note that all the pixels do not need to have different incident angle directivities from one another, but some pixels may have the same incident angle directivity.

The restoration unit 122 acquires, from the storage unit 128, a coefficient set group that corresponds to the object distance corresponding to the distance from the imaging device 121 to the object surface 102 (the object surface corresponding to the restored image) in FIG. 2, for example, and corresponds to the above coefficients $\alpha 1$ to $\alpha 3$, $\beta 1$ to $\beta 3$, and $\gamma 1$ to $\gamma 3$. The restoration unit 122 also creates simultaneous equations as expressed by Equations (1) to (3) described above, using the detection signal level of each pixel of the detection image output from the imaging device 121 and the acquired coefficient set group. The restoration unit 122 then solves the created simultaneous equations, to obtain the pixel values of the respective pixels constituting the image in which an image of the object as shown in the bottom right of FIG. 2 is formed. Thus, an image from which the user can visually recognize the object (visually recognizable object) is restored from the detection image.

The image restored from the detection image will be referred to as a restored image. However, in a case where the imaging device 121 has sensitivity only to light out of the visible wavelength band, such as ultraviolet rays, the restored image is not an image from which the object can be recognized as in a normal image, but is also referred to as a restored image in this case.

Further, a restored image that is an image in which an image of the object is formed and is an image not yet subjected to color separation such as demosaicing or a synchronization process will be hereinafter referred to as a RAW image, and a detection image captured by the imaging device 121 will be distinguished as an image compliant with the array of color filters, but not as a RAW image.

Note that the number of pixels of the imaging device 121 and the number of pixels constituting the restored image are not necessarily the same.

Further, the restoration unit 122 performs demosaicing, $\gamma$ correction, white balance adjustment, conversion into a predetermined compression format, and the like, on the restored image as necessary. The restoration unit 122 then outputs the restored image to the bus B1.

The control unit 123 includes various processors, for example, to control each component of the imaging apparatus 101 and perform various kinds of processing.

The input unit 124 includes an input device (such as keys, switches, buttons, a dial, a touch panel, or a remote controller, for example) for operating the imaging apparatus 101, inputting data to be used for processing, and the like. The input unit 124 outputs an operation signal, input data, and the like to the bus B1.

The detection unit 125 includes various sensors and the like to be used for detecting the states and the like of the imaging apparatus 101 and the object. For example, the detection unit 125 includes an acceleration sensor and a gyroscope sensor that detect the posture and movement of the imaging apparatus 101, a position detecting sensor (such as a global navigation satellite system (GNASS) receiver, for example) that detects the position of the imaging apparatus 101 and a ranging sensor or the like that detects the object distance. The detection unit 125 outputs a signal indicating a detection result to the bus B1.

The association unit 126 associates a detection image obtained by the imaging device 121 with the metadata corresponding to the detection image. The metadata includes a coefficient set group, the object distance, and the like for restoring the restored image using the target detection image, for example.

Note that the method for associating the detection image with the metadata is not limited to any particular method, as long as the correspondence relationship between the detection image and the metadata can be specified. For example, the metadata is assigned to the image data including the detection image, the same ID is assigned to the detection image and the metadata, or the detection image and the metadata are recorded on the same recording medium 130, so that the detection image and the metadata are associated with each other.

The display unit 127 is formed with a display, for example, and displays various kinds of information (such as a restored image, for example). Note that the display unit 127 may also include a sound output unit such as a speaker to output sound.

The storage unit 128 includes one or more storage devices such as a read only memory (ROM), a random access memory (RAM), and a flash memory, and stores programs, data, and the like to be used in processes by the imaging apparatus 101, for example. The storage unit 128 associates coefficient set groups corresponding to the above coefficients α1 to α3, β1 to β3, and γ1 to γ3 with various object distances, and stores the coefficient set groups, for example. More specifically, the storage unit 128 stores, for each object surface 102 at each object distance, a coefficient set group including coefficients for the respective pixels 121a of the imaging device 121 with respect to the respective point light sources set on the object surface 102, for example.

The recording/reproducing unit 129 records data on the recording medium 130, and reproduces (reads) the data recorded on the recording medium 130. For example, the recording/reproducing unit 129 records the restored image on the recording medium 130 or reads the restored image from the recording medium 130. Further, the recording/reproducing unit 129 records the detection image and the corresponding metadata on the recording medium 130, or reads the detection image and the corresponding metadata from the recording medium 130, for example.

The recording medium 130 is formed with a hard disk drive (HDD), a solid state drive (SSD), a magnetic disk, an optical disk, a magneto-optical disk, a semiconductor memory, or the like, or a combination of these media, for example.

The communication unit 131 communicates with another device (such as another imaging apparatus or a signal processing device, for example) by a predetermined communication scheme. Note that the communication scheme to be used by the communication unit 131 may be either wired or wireless. Further, the communication unit 131 can be compatible with a plurality of communication schemes.

<First Example Configuration of the Imaging Device 121>

Next, a first example configuration of the imaging device 121 of the imaging apparatus 101 shown in FIG. 1 is described with reference to FIGS. 3 and 4.

Figure 3:
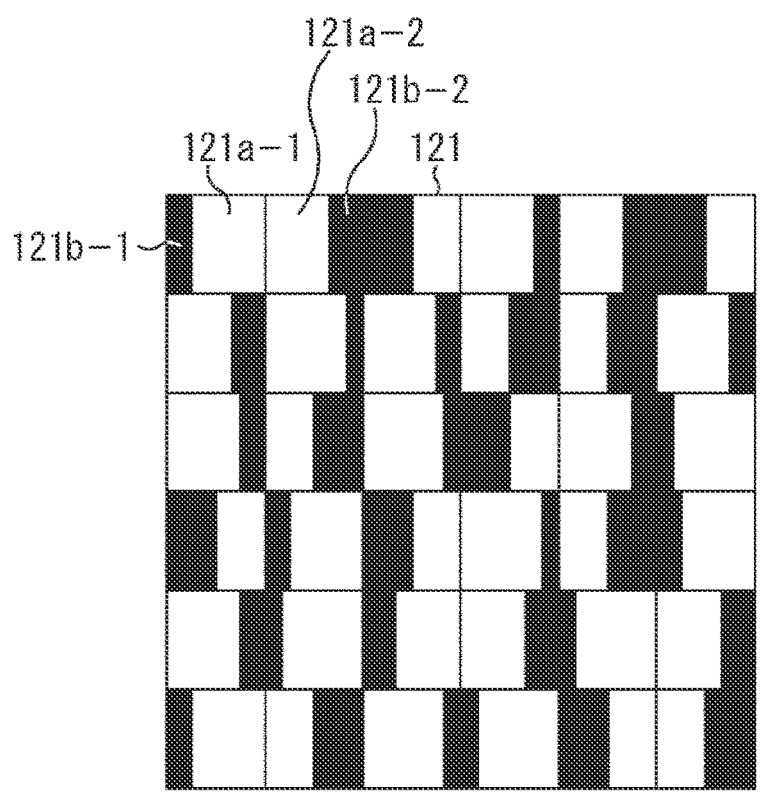
FIG. 3 is a diagram showing an example configuration of the pixel array unit of the imaging device shown in FIG. 1.

FIG. 3 shows a front view of part of the pixel array unit of the imaging device 121. Note that FIG. 3 shows an example case where the number of pixels in the pixel array unit is 6×6. However, the number of pixels in the pixel array unit is not limited to this.

In the imaging device 121 shown in FIG. 3, a light shielding film 121b that is one of modulation elements is provided for each pixel 121a so as to cover part of the light receiving region (light receiving surface) of the photodiode, and incident light entering each pixel 121a is optically modulated in accordance with the incident angle. The light shielding film 121b is then provided in a different region for each pixel 121a, the light-receiving, sensitivity with respect to the incident angle of incident light varies with each pixel 121a, and each pixel 121a has a different incident angle directivity, for example.

For example, in a pixel 121a-1 and a pixel 121a-2, the ranges in which the light receiving regions of the photodiodes are shielded from light by a light shielding film 121b-1 and a light shielding film 121b-2 are different (at least the light shielding regions (positions) or the light shielding areas are different). Specifically, in the pixel 121a-1, the light shielding film. 121b-1 is provided so as to shield part of the left-side portion of the light receiving region of the photodiode from light by a predetermined width. On the other hand, in the pixel 121a-2, the light shielding film 121b-2 is provided so as to shield part of the right-side portion of the light receiving region from light by a predetermined width. Note that the width by which the light shielding film 121b-1 shields the light receiving region of the photodiode from light and the width by which the light shielding film 121b-2 shields the light receiving region of the photodiode from light may be different or may be the same. Likewise, in the other pixels 121a, the light shielding films 121b are randomly disposed in the pixel array unit so as to shield a different region in the light receiving region from light for each pixel.

Figure 4:
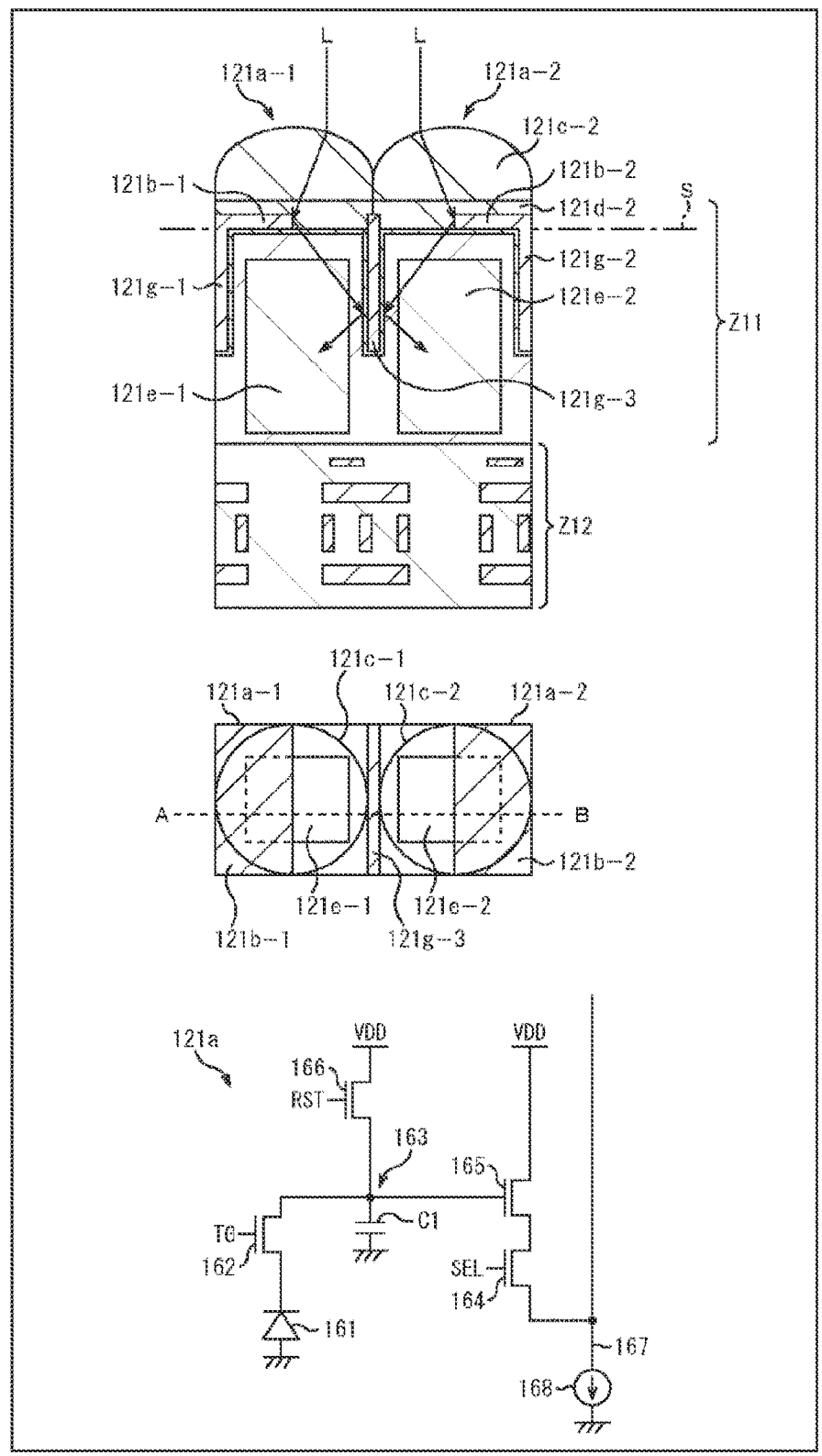
FIG. 4 is a diagram for explaining a first example configuration of the imaging device shown in FIG. 1.

The top portion of FIG. 4 is a side cross-sectional view of the first example configuration of the imaging device 121, and the middle portion of FIG. 4 is a top view of the first example configuration of the imaging device 121. The side cross-sectional view an the top portion of FIG. 4 is also an A-B cross-section in the middle portion of FIG. 4. Further, the bottom portion of FIG. 4 shows an example circuit configuration of the imaging device 121.

In the imaging device 121 in the top portion of FIG. 4, incident light enters from the top side toward the bottom side of the drawing. The adjacent pixels 121a-1 and 121a-2 are of a so-called back-illuminated type, having a wiring layer Z12 provided as the lowermost layer in the drawing and a photoelectric conversion layer Z11 provided thereon.

Note that, in the description below, in a case where there is no need to distinguish the pixels 121a-1 and 121a-2 from each other, the number at the end of each reference numeral will be omitted, and the pixels will be simply referred to as the pixels 121a. In the description below, numbers and alphabets at the end of reference numerals might be omitted too for other components in the specification.

Further, FIG. 4 shows a side view and a top view of only two of the pixels constituting the pixel array unit of the imaging device 121, and more pixels 121a are of course also provided but are not shown in the drawings.

The pixels 121a-1 and 121a-2 further include photodiodes 121e-1 and 121e-2, respectively, in the photoelectric conversion layer Z11. Furthermore, on the photodiodes 121e-1 and 121e-2, on-chip lenses 121c-1 and 121c-2, and color filters 121d-1 and 121d-2 are stacked in this order from the top.

The on-chip lenses 121c-1 and 121c-2 condense incident light onto the photodiodes 121e-1 and 121e-2.

The color filters 121d-1 and 121d-2 are optical filters that transmit light of a specific wavelength such as red, green, blue, infrared, and white, for example. Note that, in the case of white, the color filters 121d-1 and 121d-2 may be transparent filters, or may not be provided.

In the photoelectric conversion layer Z11 of the pixels 121a-1 and 121a-2, light shielding films 121g-1 to 121g-3 are formed at boundaries between the respective pixels, and prevent incident light L from entering the adjacent pixels and causing crosstalk, as shown in FIG. 4, for example.

Further, as shown in the top and the middle portions of FIG. 4, the light shielding films 121b-1 and 121b-2 shield part of the light receiving surface S from light as viewed from above. On the light receiving surface S of the photodiodes 121e-1 and 121e-2 in the pixels 121a-1 and 121a-2, different regions are shielded from light by the light shielding films 121b-1 and 121b-2, so that a different incident angle directivity is set independently for each pixel. However, the regions to be shielded from light do not need to be different among all the pixels 121a of the imaging device 121, and there may be some pixels 121a among which the same region is shielded from light.

Note that, as shown in the top portion of FIG. 4, the light shielding film 121b-1 and the light shielding film 121g-1 are connected to each other, and are arranged in an L shape when viewed from the side. Likewise, the light shielding film 121b-2 and the light shielding film 121g-2 are connected to each other, and are arranged in an L shape when viewed from the side. Further, the light shielding film 121b-1, the light shielding film 121b-2, and the light shielding films 121g-1 to 121g-3 are formed with a metal, and, for example, are formed with tungsten (N), aluminum (Al), or an alloy of Al and copper (Cu). Also, the light shielding film 121b-1, the light shielding film 121b-2, and the light shielding films 121g-1 to 121g-3 may be simultaneously formed with the same metal as the wiring lines in the same process as the process of forming the wiring lines in a semiconductor process. Note that the thicknesses of the light shielding film 121b-1, the light shielding film 121b-2, and the light shielding films 121g-1 to 121g-3 may not be the same depending on positions.

Further, as shown in the bottom portion of FIG. 4, a pixel 121a includes a photodiode 161 (corresponding to the photodiode 121e), a transfer transistor 162, a floating diffusion (FD) unit 163, a select transistor 164, an amplification transistor 165, and a reset transistor 166, and is connected to a current source 168 via a vertical signal line 167.

The anode electrode of the photodiode 161 is grounded, and the cathode electrode of the photodiode 161 is connected to the gate electrode of the amplification transistor 165 via the transfer transistor 162.

The transfer transistor 162 is driven in accordance with a transfer signal TG. For example, when the transfer signal TG supplied to the gate electrode of the transfer transistor 162 switches to the high level, the transfer transistor 162 is turned on. As a result, the electric charge accumulated in the photodiode 161 is transferred to the FD unit 163 via the transfer transistor 162.

The FD unit 163 is a floating diffusion region that has a charge capacity C1 and is provided between the transfer transistor 162 and the amplification transistor 165, and temporarily accumulates the electric charge transferred from the photodiode 161 via the transfer transistor 162. The FD unit 163 is a charge detection unit that converts electric charge into voltage, and the electric charge accumulated in the FD unit 163 is converted into voltage at the amplification transistor 165.

The select transistor 164 is driven in accordance with a select signal SEL. When the select signal SEL supplied to the gate electrode of the select transistor 164 is switched to the high level, the select transistor 164 is turned on, to connect the amplification transistor 165 and the vertical signal line 167.

The amplification transistor 165 serves as the input unit for a source follower that is a readout circuit that reads out a signal obtained through photoelectric conversion performed at the photodiode 161, and outputs a detection signal (pixel signal) at the level corresponding to the electric charge accumulated in the FD unit 163, to the vertical signal line 167. That is, the amplification transistor 165 has its drain terminal connected to a power supply VDD, and its source terminal connected to the vertical signal line 167 via the select transistor 164, to form a source follower together with the current source 168 connected to one end of the vertical signal line 167. The value (output pixel value) of the detection signal is modulated in accordance with the incident angle of incident light from the object, and has characteristics (directivity) that vary with the incident angle (or has an incident angle directivity).

The reset transistor 166 is driven in accordance with a reset signal RST. For example, when the reset signal RST supplied to the gate electrode of the reset transistor 166 is switched to the high level, the electric charge accumulated in the FD unit 163 is released to the power supply VDD, so that the FD unit 163 is reset.

Note that the shape of the light shielding film 121b of each pixel 121a is not limited to the example shown in FIG. 3, but can have any appropriate shape. For example, it is possible to adopt a shape extending in the horizontal direction in FIG. 3, an L shape extending in the vertical direction and the horizontal direction, a shape having a rectangular opening, or the like.

<Second Example Configuration of the Imaging Device 121>

Figure 5:
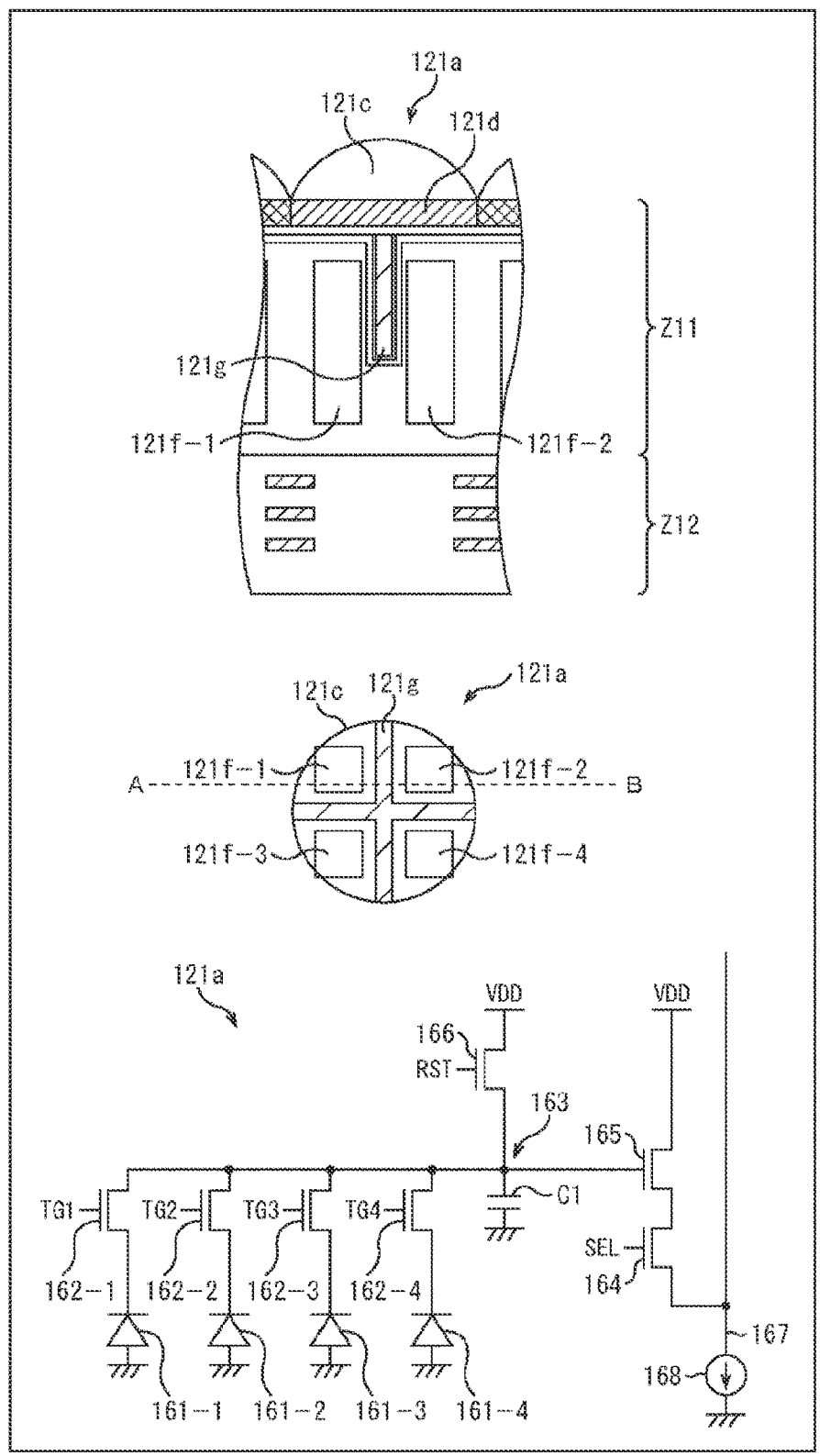
FIG. 5 is a diagram for explaining a second example configuration of the imaging device shown in FIG. 1.

FIG. 5 is a diagram showing a second example configuration of the imaging device 121. The top portion of FIG. 5 shows a side cross-sectional view of a pixel 121a of the imaging device 121 as the second example configuration, and the middle portion of FIG. 5 shows a top view of the imaging device 121. The side cross-sectional view in the top portion of FIG. 5 is also an A-B cross-section in the middle portion of FIG. 5. Further, the bottom portion of FIG. 5 shows an example circuit configuration of the imaging device 121.

The configuration of the imaging device 121 in FIG. 5 differs from that of the imaging device 121 in FIG. 4 in that four photodiodes 121f-1 to 121f-4 are formed in one pixel 121a, and a light shielding film 121g is formed in a region that separates the photodiodes 121f-1 to 121f-4 from one another. That is, in the imaging device 121 in FIG. 5, the light shielding film 121g is formed in a cross shape as viewed from above. Note that the same components as those shown in FIG. 4 are denoted by the same reference numerals as those in FIG. 4, and detailed explanation of them is not made herein.

In the imaging device 121 in FIG. 5, the photodiodes 121f-1 to 121f-4 are separated by the light shielding film 121g, so that occurrence of electrical and optical crosstalk among the photodiodes 121f-1 to 121f-4 is prevented. That is, like the light shielding films 121g of the imaging device 121 in FIG. 4, the light shielding film 121g in FIG. 5 is for preventing crosstalk, and is not for providing an incident angle directivity.

Further, in the imaging device 121 in FIG. 5, one FD unit 163 is shared among the four photodiodes 121f-1 to 121f-4. The bottom portion of FIG. 5 shows an example circuit configuration in which one FD unit 163 is shared among the four photodiodes 121f-1 to 121f-4. Note that, as for the bottom portion of FIG. 5, explanation of the same components as those shown in the bottom portion of FIG. 4 is not made herein.

The circuit configuration shown in the bottom portion of FIG. 5 differs from that shown in the bottom portion of FIG. 4 in that photodiodes 161-1 to 161-4 (corresponding to the photodiodes 121*f*-1 to 121*f*-4 in the top portion of FIG. 5) and transfer transistors 162-1 to 162-4 are provided in place of the photodiode 161 (corresponding to the photodiode 121*e* in the top portion of FIG. 4) and the transfer transistor 162, and the FD unit 163 is shared.

With such a configuration, the electric charges accumulated in the photodiodes 121*f*-1 to 121*f*-4 is transferred to the common FD unit 163 having a predetermined capacity provided in the connecting portion between the photodiodes 121*f*-1 to 121*f*-4 and the gate electrode of the amplification transistor 165. A signal corresponding to the level of the electric charge retained in the FD unit 163 is then read as a detection signal (pixel signal).

Accordingly, the electric charges accumulated in the photodiodes 121*f*-1 to 121*f*-4 can be made to selectively contribute to the output of the pixel 121*a*, or the detection signal in various combinations. That is, electric charges can be read independently from each of the photodiodes 121*f*-1 to 121*f*-4, and the photodiodes 121*f*-1 to 121*f*-4 to contribute to outputs (or the degrees of contribution of the photodiodes 121*f*-1 to 121*f*-4 to out are made to differ from one another. Thus, different incident angle directivities can be obtained.

For example, the electric charges in the photodiode 121*f*-1 and the photodiode 121*f*-3 are transferred to the FD unit 163, and the signals obtained by reading the respective electric charges are added, so that an incident angle directivity in the horizontal direction can be obtained. Likewise, the electric charges in the photodiode 121*f*-1 and the photodiode 121*f*-2 are transferred to the FD unit 163, and the signals obtained by reading the respective electric charges are added, so that an incident angle directivity in the vertical direction can be obtained.

Further, a signal obtained on the basis of the electric charges selectively read out independently from the four photodiodes 121*f*-1 to 121*f*-4 is a detection signal corresponding to one pixel of a detection image.

Note that contribution of (the electric charge in) each photodiode 121*f* to a detection signal depends not only on whether or not the electric charge (detection value) in each photodiode 121*f* is to be transferred to the FD unit 163, but also on resetting of the electric charges accumulated in the photodiodes 121*f* before the transfer to the FD unit 163 using an electronic shutter function or the like, for example. For example, if the electric charge in a photodiode 121*f* is reset immediately before the transfer to the FD unit 163, the photodiode 121*f* does not contribute to a detection signal at all. On the other hand, time is allowed between resetting the electric charge in a photodiode 121*f* and transfer of the electric charge to the FD unit 163, so that the photodiode 121*f* partially contributes to a detection signal.

As described above, in the case of the imaging device 121 in FIG. 5, the combination to be used for a detection signal is changed among the four photodiodes 121*f*-1 to 121*f*-4, so that a different incident angle directivity can be provided for each pixel. Further, a detection signal that is output from each pixel 121*a* of the imaging device 121 in FIG. 5 has a value (output pixel value) modulated in accordance with the incident angle of incident light from the object, and has characteristics (directivity) that vary with the incident angle (has an incident angle directivity).

Note that, in the imaging device 121 in FIG. 5, incident light is enters all the photodiodes 121*f*-1 to 121*f*-4 without being optically modulated. Therefore, a detection signal is not a signal obtained by optical modulation. Meanwhile, a photodiode 121*f* that does not contribute to a detection signal will be hereinafter also referred to as a photodiode 121*f* that does not contribute to the pixel or its output.

Further, FIG. 5 shows an example in which the light receiving surface of a pixel (a pixel 121*a*) is divided into four equal regions, and the photodiodes 121*f* each having a light receiving surface of the same size are disposed in the respective regions, or an example in which a photodiode is divided into four equal portions. However, the number of divisions and dividing positions of a photodiode can be set as appropriate.

For example, a photodiode is not necessarily divided into equal portions, and the dividing positions of the photodiode may vary with each pixel. Therefore, even if the photodiodes 121*f* at the same position among a plurality of pixels are made to contribute to outputs, for example, the incident angle directivity varies among the pixels. Also, the number of divisions is made to vary among the pixels, for example, incident angle directivities can be set more freely. Further, both the number of divisions and the dividing positions may be made to vary among the pixels, for example.

Furthermore, both The imaging device 121 in FIG. 4 and the imaging device 121 in FIG. 5 have a configuration in which each pixel can have an incident angle directivity that is set independently. Note that, in the imaging device 121 in FIG. 4, the incident angle directivity of each pixel is set at the time of manufacturing by the light shielding film 121*b*. In the imaging device 121 in FIG. 5, on the other hand, the number of divisions and the dividing position of the photodiode of each pixel are set at the time of manufacturing, but the incident angle directivity (the combination of photodiodes to contribute to an output) of each pixel can be set at a time of use (for example, at a time of imaging). Note that, in both the imaging device 121 in FIG. 4 and the imaging device 121 in FIG. 5, not all the pixels necessarily need to have an incident angle directivity.

Note that, as for the imaging device 121 in FIG. 4, the shape of the light shielding film 121*b* of each pixel 121*a* will be hereinafter referred to as a light shielding pattern. Meanwhile, as for the imaging device 121 of FIG. 5, the shape of the region of a photodiode 121*f* that does not contribute to an output in each pixel 121*a* will be hereinafter referred to as a light shielding pattern.

<Principles of Generating an Incident Angle Directivity>

Figure 6:
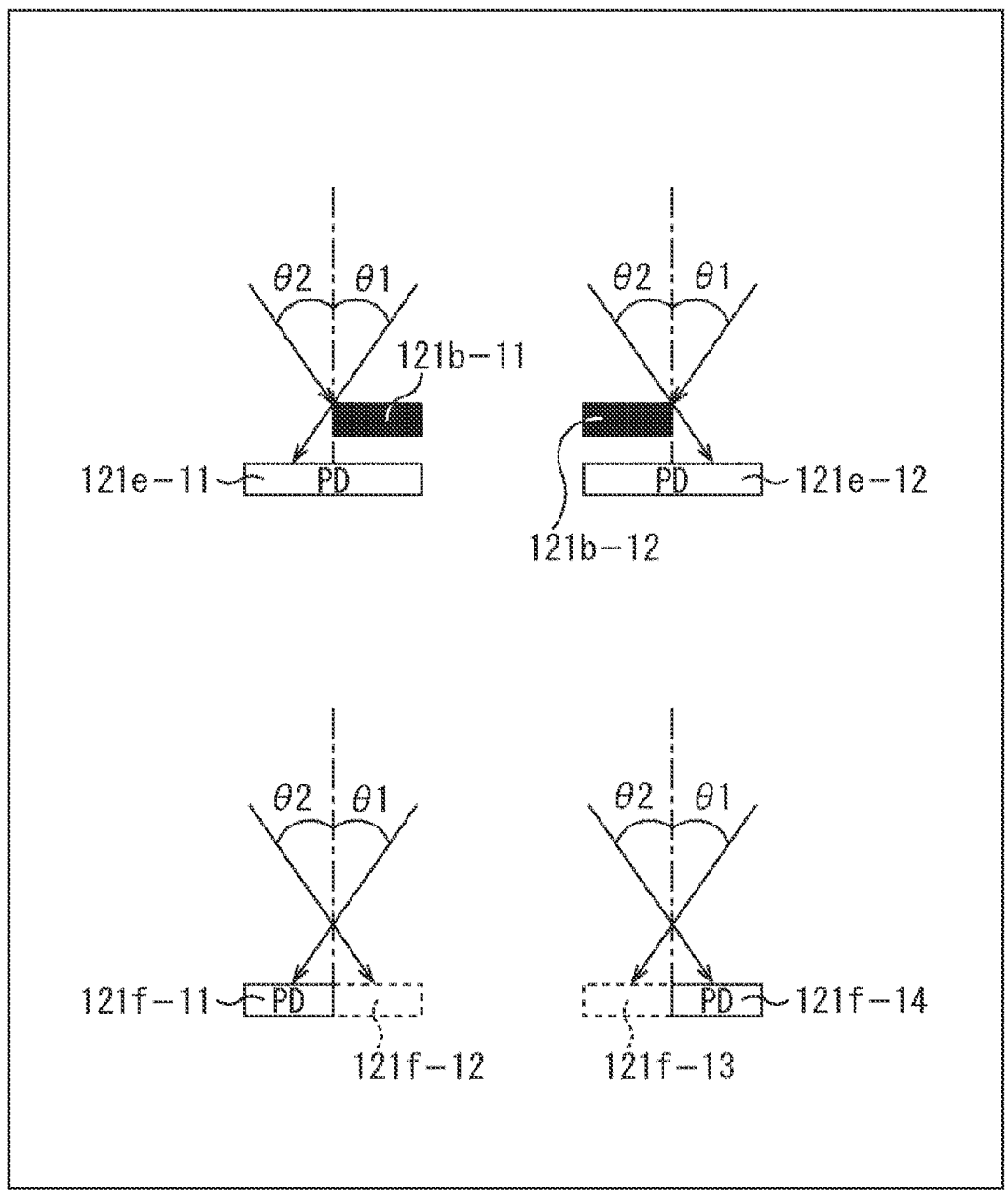
FIG. 6 is a diagram for explaining the principles of Generation of incident angle directivities.

The incident angle directivity of each pixel of the imaging device 121 is generated by the principles illustrated in FIG. 6, for example. Note that the top left portion and the top right portion of FIG. 6 are diagrams for explaining the principles of generation of an incident angle directivity in the imaging device 121 shown in FIG. 4. The bottom left portion and the bottom right portion of FIG. 6 are diagrams for explaining the principles of generation of an incident angle directivity in the imaging device 121 shown in FIG. 5.

Each of the pixels in the top left portion and the top right portion of FIG. 6 includes one photodiode 121*e*. On the other hand, each of the pixels in the bottom left portion and the bottom right portion of FIG. 6 includes two photodiodes 121*f*. Note that an example in which one pixel includes two photodiodes 121*f* is shown herein, for ease of explanation. However, the number of photodiodes 121*f* included in one pixel may be other than two.

In the pixel shown in the top left portion of FIG. 6, a light shielding film 121*b*-11 is formed so as to shield the right half of the light receiving surface of the photodiode 121*e*-11. Meanwhile, in the pixel shown in the top right portion of FIG. 6, a light shielding film 121*b*-12 is formed so as to shield the left half of the light receiving surface of the photodiode 121*e*-12. Note that each dot-and-dash line in the drawing is an auxiliary line that passes through the center of the light receiving surface of the photodiode 121e in the horizontal direction and is perpendicular to the light receiving surface.

For example, in the pixel shown in the top left portion of FIG. 6, incident light from upper right that forms an incident angle θ1 with the dot-and-dash line in the drawing is easily received by the left half region of the photodiode 121e-11 that is not shielded from light by the light shielding film 121b-11. On the other hand, incident light from upper left that forms an incident angle θ2 with the dot-and-dash line in the drawing is hardly received by the left half region of the photodiode 121e-11 that is not shielded from light by the light shielding film 121b-11. Accordingly, the pixel shown in the top left portion of FIG. 6 has an incident angle directivity with a high light-receiving sensitivity to incident light from upper right in the drawing and a low light-receiving sensitivity to incident light from upper left.

Meanwhile, in the pixel shown in the top right portion of FIG. 6, for example, incident light from upper right that forms the incident angle θ1 is hardly received by the left half region or the photodiode 121e-12 shielded from light by the light shielding film 121b-12.

On the other hand, incident light from upper left that forms the incident angle θ2 with the dot-and-dash line is easily received by the right half region of the photodiode 121e-12 that is not shielded from light by the light shielding film 121b-12. Accordingly, the pixel shown in the top right portion of FIG. 6 has an incident angle directivity with a low light-receiving sensitivity to incident light from upper right in the drawing and a high light-receiving sensitivity to incident light from upper left.

Further, in the pixel shown in the bottom left portion of FIG. 6, photodiodes 121f-11 and 121f-12 are provided on the right and left sides in the drawing, and one of the detection signals is read. Thus, the pixel has an incident angle directivity, without any light shielding film 121b.

Specifically, in the pixel shown in the bottom left portion of FIG. 6, only the signal of the photodiode 121f-11 provided on the left side in the drawing is read out. Thus, an incident angle directivity similar to that of the pixel shown in the top left portion of FIG. 6 can be obtained. That is, incident light from upper right that forms the incident angle θ1 with the dot-and-dash line in the drawing enters the photodiode 121f-11, and the signal corresponding to the amount of received light is read out from the photodiode 121f-11. Thus, the incident light contributes to the detection signal to be output from this pixel. On the other hand, incident light from upper left that forms the incident angle θ2 with the dot-and-dash line in the drawing enters the photodiode 121f-12, but is not read out from the photodiode 121f-12. Therefore, the incident light does not contribute to the detection signal to be output from this pixel.

Likewise, in a case where two photodiodes 121f-13 and 121f-14 are included as in the pixel shown in the bottom right portion of FIG. 6, only the signal of the photodiode 121f-14 provided on the right side in the drawing is read out, so that an incident angle directivity similar to that of the pixel shown in the top right portion of FIG. 6 can be obtained. That is, incident light from upper right that forms the incident angle θ1 enters the photodiode 121f-13, but any signal is not read out from the photodiode 121f-13. Therefore, the incident light does not contribute to the detection signal to be output from this pixel. On the other hand, incident light from upper left that forms the incident angle θ2 enters the photodiode 121f-14, and the signal corresponding to the amount of received light is read out from the photodiode 121f-14. Thus, the incident light contributes to the detection signal to be output from this pixel.

Note that, in each pixel shown in the top portions of FIG. 6, the region shielded from light and the region not shielded from light are divided at the center position of (the light receiving surface of the photodiode 121e of) the pixel in the horizontal direction in the example described above. However, the regions may be divided at some other position. Meanwhile, in each pixel shown in the bottom portions of FIG. 6, the two photodiodes 121f are divided at the center position of the pixel in the horizontal direction in the example described above. However, the two photodiodes may be divided at some other position. As the light-shielded region or the position at which the photodiodes 121f are divided is changed in the above manner, different incident angle directivities can be generated.

<Incident Angle Directivities in Configurations Including On-Chip Lenses>

Next, incident angle directivities in configurations including on-chip lenses 121c are described with reference to FIG. 7.

Figure 7:
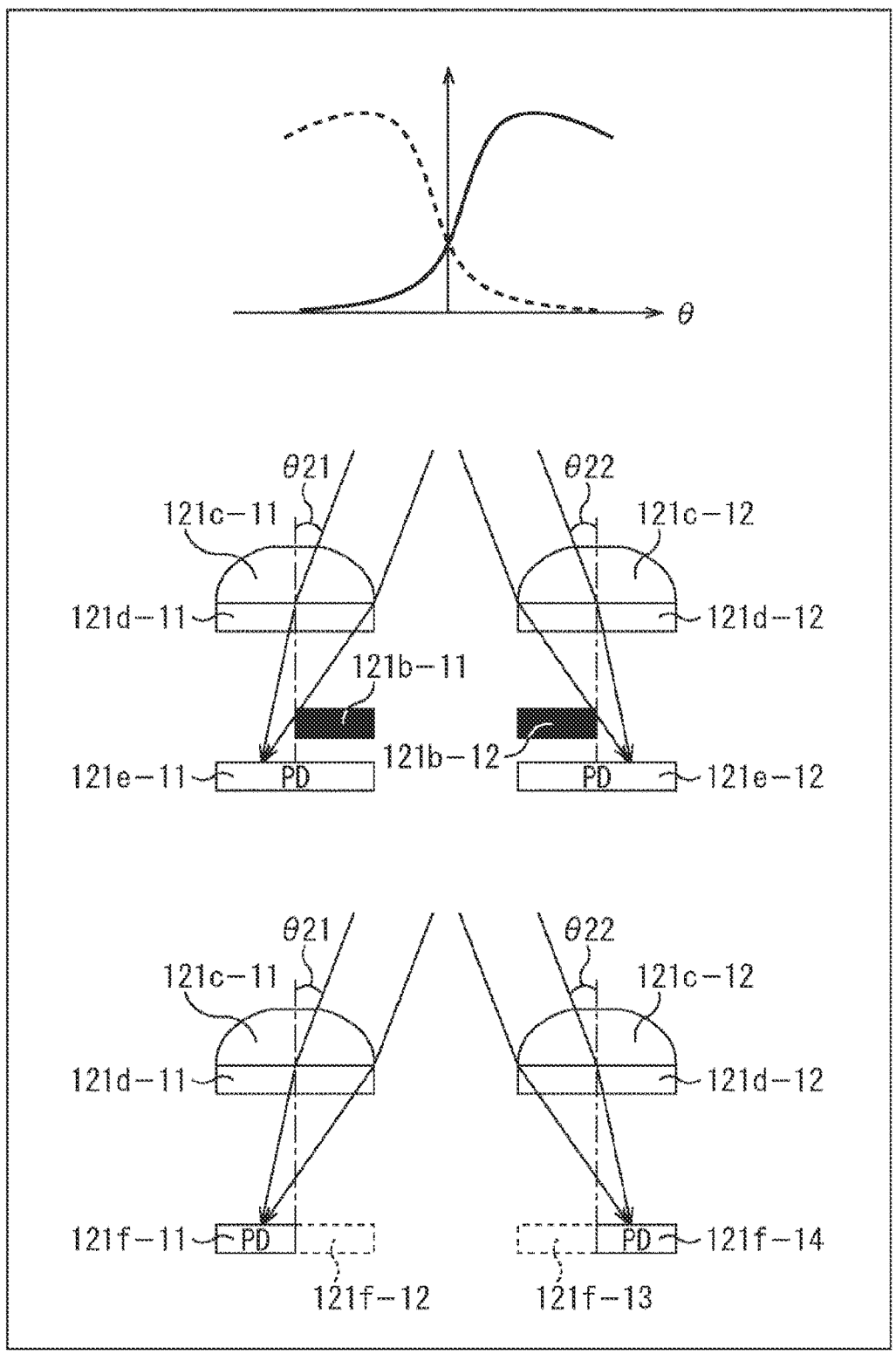
FIG. 7 is a diagram for explaining changes in incident angle directivity using on-chip lenses.

The graph in the top portion of FIG. 7 shows the incident angle directivities of the pixels shown in the middle and bottom portions of FIG. 7. Note that the abscissa axis indicates incident angle θ, and the ordinate axis indicates detection signal level. Note that the incident angle θ is 0 degrees in a case where the direction of incident light coincides with the dot-and-dash line on the left side of the middle part of FIG. 7, the incident angle θ 21 side on the left side in the middle portion of FIG. 7 is a positive direction, and the side of an incident angle θ22 on the right side in the middle portion of FIG. 7 is a negative direction. Accordingly, the incident angle of incident light entering the on-chip lens 121c from upper right is greater than that of incident light entering from upper left. That is, the incident angle θ is greater when the inclination of the traveling direction of incident light to the left is greater (or the incident angle θ increases in the positive direction), and the incident angle θ is smaller when the inclination of the traveling direction of incident light to the right is greater (or the incident angle θ increases in the negative direction).

Meanwhile, the pixel shown in the middle left portion of FIG. 7 is obtained by adding an on-chip lens 121c-11 that condenses incident light and a color filter 121d-11 that transmits light of a predetermined wavelength, to the pixel shown in the top left portion of FIG. 6. That is, in this pixel, the on-chip lens 121c-11, the color filter 121d-11, the light shielding film 121b-11, and the photodiode 121e-11 are stacked in this order from the incident direction of light from above in the drawing.

Likewise, the pixel shown in the middle right portion of FIG. 7, the pixel shown in the bottom left portion of FIG. 7, and the pixel shown in the bottom right portion of FIG. 7 are obtained by adding an on-chip lens 121c-11 and a color filter 121d-11, or an on-chip lens 121c-12 and a color filter 121d-12 to the pixel shown in the top right portion of FIG. 6, the pixel shown in the bottom left portion of FIG. 6, and the pixel shown in the bottom right portion of FIG. 6, respectively.

In the pixel shown in the middle left portion of FIG. 7, as indicated by the solid-line waveform in the top portion of FIG. 7, the detection signal level (light-receiving sensitivity) of the photodiode 121e-11 varies depending on the incident angle θ of incident light That is, when the incident angle θ, which is the angle formed by incident light with respect to the dot-and-dash line in the drawing, is greater (or when the incident angle θ is greater in the positive direction (or inclines to the right in the drawing)), light is condensed in the region in which the light shielding film 121b-11 is not provided, and accordingly, the detection signal level of the photodiode 121e-11 becomes higher. Conversely, when the incident angle θ of incident light is smaller (or when the incident angle θ is greater in the negative direction (as inclines to the left in the drawing)), light is condensed in the region in which the light shielding film 121b-11 is provided, and accordingly, the detection signal level of the photodiode 121e-11 becomes lower.

Also, in the pixel shown in the middle right portion of FIG. 7, as indicated by the dashed-line waveform in the top portion of FIG. 7, the detection signal level (light-receiving sensitivity) of the photodiode 121e-12 varies depending on the incident angle θ of incident light. Specifically, when the incident angle θ of incident light is greater (or when the incident angle θ is greater in the positive direction), light is condensed in the region in which the light shielding film 121b-12 is provided, and accordingly, the detection signal level of the photodiode 121e-12 becomes lower. Conversely, when the incident angle θ of incident light is smaller (or when the incident angle θ is greater in the negative direction), light is condensed in the region in which the light shielding film 121b-12 is not provided, and accordingly, the detection signal level of the photodiode 121e-12 becomes higher.

The solid-line and dashed-line waveforms shown in the top portion of FIG. 7 can be made to vary depending on the region of the light shielding film 121b. Accordingly, different incident angle directivities that vary with the respective pixels can be generated, depending on the region of the light shielding film 121b.

As described above, an incident angle directivity is the characteristics of the light-receiving sensitivity of each pixel depending on the incident angle θ, but it can also be said that this is the characteristics of the light shielding value depending on the incident angle θ in each pixel in the middle portions of FIG. 7. That is, the light shielding film 121b blocks incident light in a specific direction at a high level, but cannot sufficiently block incident light from other directions. The changes caused in level by this light shielding generates detection signal levels that vary with the incident angle θ as shown in the top portion of FIG. 7. Therefore, when the direction in which light can be blocked at the highest level in each pixel is defined as the light shielding direction of each pixel, the respective pixels having different incident angle directivities from one another means the respective pixels having different light shielding directions from one another.

Further, in the pixel shown in the bottom left portion of FIG. 7, only the signal of the photodiode 121f-11 in the left portion of the drawing is used, so that an incident angle directivity similar to that of the pixel shown in the middle left portion of FIG. 7 can be obtained, as in the pixel shown in the bottom left portion of FIG. 6. That is, as the incident angle θ of incident light becomes greater (or as the incident angle θ becomes greater in the positive direction), light is condensed in the region of the photodiode 121f-11 from which the signal is to be read, and accordingly, the detection signal level becomes higher. Conversely, as the incident angle θ of incident light is smaller (or as the incident angle θ is greater in the negative direction), light is condensed in the region of the photodiode 121f-12 from which the signal is not to be read, and accordingly, the detection signal level becomes lower.

Further, likewise, in the pixel shown in the bottom right portion of FIG. 7, only the signal of the photodiode 121f-14 in the right portion of the drawing is used, so that an incident angle directivity similar to that of the pixel shown in the middle right portion of FIG. 7 can be obtained, as in the pixel shown in the bottom right portion of FIG. 6. That is, when the incident angle θ of incident light is greater (or when the incident angle θ is greater in the positive direction), light is condensed in the region of the photodiode 121f-13 that does not contribute to the output (detection signal), and accordingly, the level of the detection signal of each pixel becomes lower. Conversely, when the incident angle of incident light is smaller (or when the incident angle θ is greater in the negative direction), light is condensed in the region of the photodiode 121f-14 that contributes to the output (detection signal), and accordingly, the level of the detection signal in each pixel becomes higher.

Note that, as in the pixels shown in the bottom portions of FIG. 7, in a pixel that includes a plurality of photodiodes so as to be able to change the photodiode contributing to an output, each photodiode is made to have a directivity with respect to the incident angle of incident light. The on-chip lenses 121c need to be provided in each pixel so that an incident angle directivity is generated in each pixel.

Note that, in the description below, an example case where pixels 121a that achieve incident angle directivities using the light shielding films 121b like the pixel. 121a shown in FIG. 4 will be mainly described. However, unless the light shielding films 121b are necessary, it is also possible to use pixels 121a that basically divides photodiodes to obtain incident angle directivities.

<Relationship Between Light-Shielded Region and Angle of View>

Next, the relationship between the light-shielded regions and the angles of view is described with reference to FIGS. 8 and 9.

Figure 8:
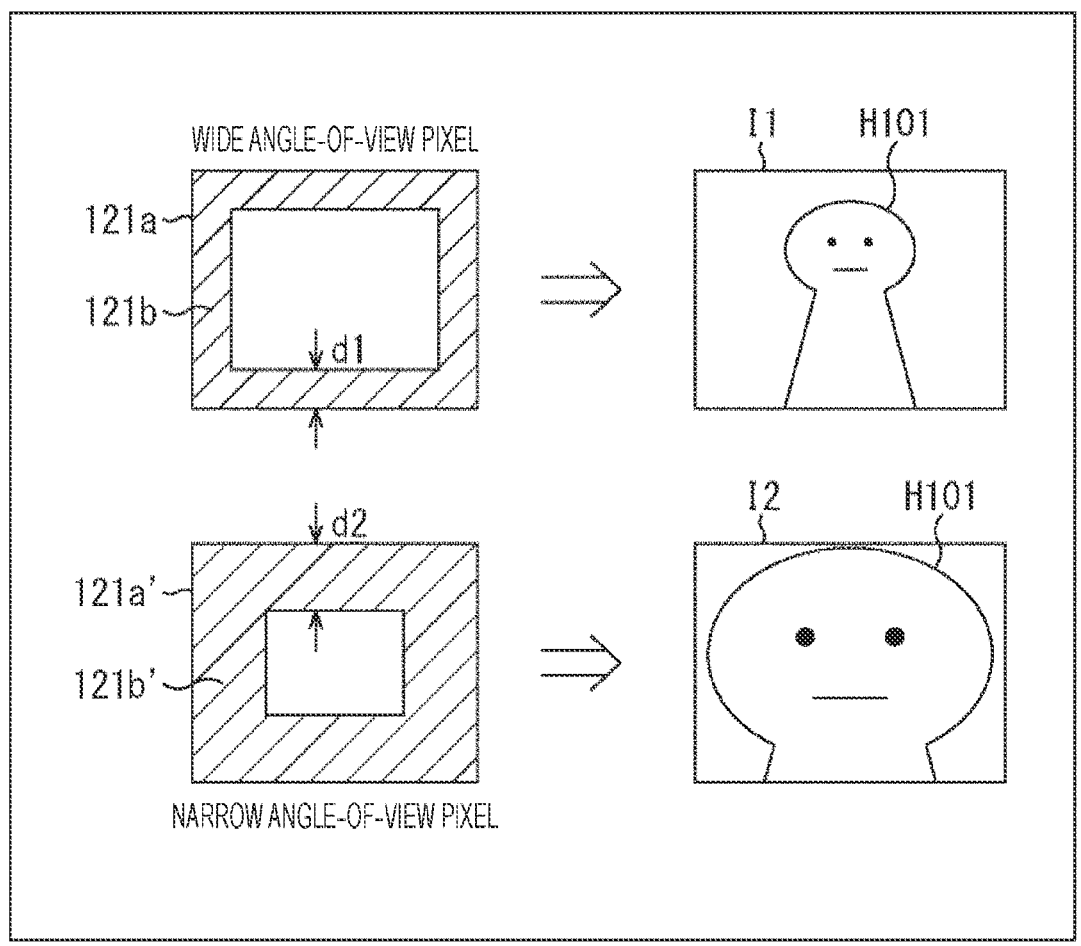
FIG. 8 is a diagram for explaining the relationship between a narrow angle-of-view pixel and a wide angle-of-view pixel.

For example, a pixel 121a shielded from light by the light shielding film 121b by a width d1 from each edge of the four sides as shown in the top portion of FIG. 8, and a pixel 121a' shielded from light by the light shielding film 121b by a width d2 (>d1) from each edge of the four sides as shown in the bottom portion of FIG. 8 are now described.

Figure 9:
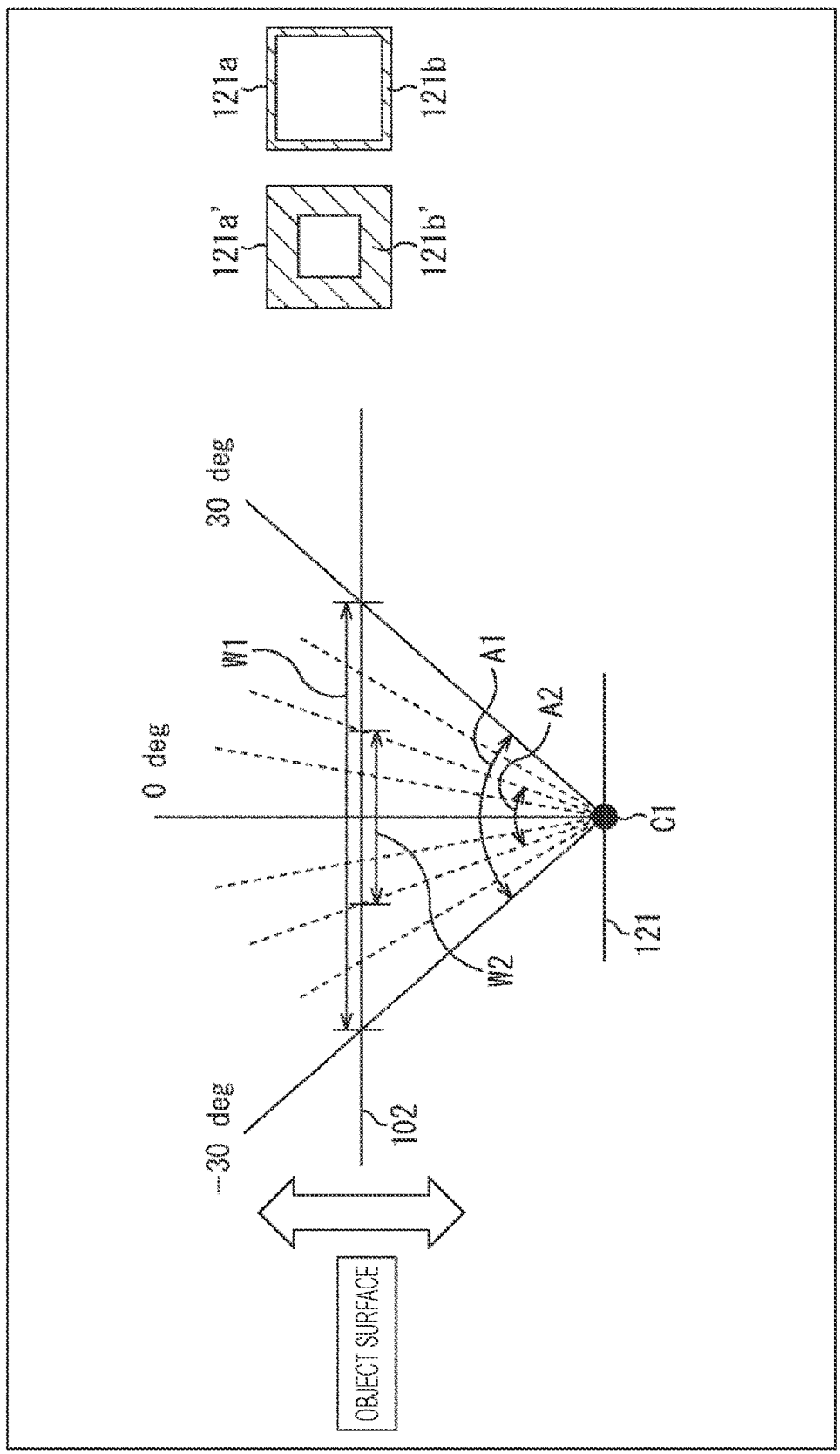
FIG. 9 is a diagram for explaining the relationship between a narrow angle-of-view pixel and a wide angle-of-view pixel.

FIG. 9 shows an example of incident angles of incident light from the object surface 102 to the center position C1 of the imaging device 121. Note that FIG. 9 shows a example of incident angles of incident light in the horizontal direction, but similar incident angles are observed in the vertical direction. Further, the right portion of FIG. 9 shows the pixels 121a and 121a' shown in FIG. 8.

For example, in a case where the pixel 121a shown in FIG. 8 is disposed at the center position C1 of the imaging device 121, the range of the incident angle of incident light from the object surface 102 to the pixel 121a is represented by an angle A1 as shown in the left portion of FIG. 9. Accordingly, the pixel 121a can receive incident light of the width W1 of the object surface 102 in the horizontal direction.

On the other hand, in a case where the pixel 121a' in FIG. 8 is disposed at the center position C1 of the imaging device 121, the range of the incident angle of incident light from the object surface 102 to the pixel 121a' is represented by an angle A2 (<A1) as shown in the left portion of FIG. 9, because the pixel 121a' has a wider light-shielded region than the pixel 121a. Therefore, the pixel 121a' can receive incident light of the width W2 (<W1) of the object surface 102 in the horizontal direction.

That is, the pixel 121a having a narrow light-shielded region is a wide angle-of-view pixel suitable for imaging a wide region on the object surface 102, while the pixel 121a' having a wide light-shielded region is a narrow angle-of-view pixel suitable for imaging a narrow region on the object surface 102. Note that the wide angle-of-view pixel and the narrow angle-of-view pixel mentioned herein are expressions for comparing both the pixels 121a and 121a' shown in FIG. 8, and are not limited to these pixels in comparing pixels having other angles of view.

Therefore, the pixel 121a is used to restore an image I1 shown in FIG. 8, for example. On the other hand, the pixel 121a' is used to restore an image I2 shown in FIG. 8, for example.

Note that the angle of view SQ2 is smaller than the angle of view SQ1. Therefore, in a case where an image of the angle of view SQ2 and an image of the angle of view SQ1 are to be restored with the same number of pixels, it is possible to obtain a restored image with higher image quality by restoring the image of the angle of view SQ2 than by restoring the image of the angle of view SQ1. That is, in a case where restored images are to be obtained with the same number of pixels, a restored image with higher image quality can be obtained by restoring an image with a smaller angle of view.

Alternatively, coefficient set groups corresponding to the angles of view of restored images in addition to object distances may be further prepared as described above, for example, and a restored image may be restored with the use of the coefficient set group corresponding to the object distance and the angle of view. Note that the resolution with respect to the object distance and the angle of view depends on the number of prepared coefficient set groups.

Further, in a case where the object distance and the angle of view can be specified, a restored image may be generated with the use of a detection signal of a pixel having an incident angle directivity suitable for imaging of the object surface corresponding to the specified object distance and angle of view, without the use of all the pixels. As a result, the restored image can be generated with the use of the detection signal of a pixel suitable for imaging the object surface corresponding to the specified object distance and angle of view.

<Example Configuration of the Pixel Region of the Imaging Device 121>

Figure 10:
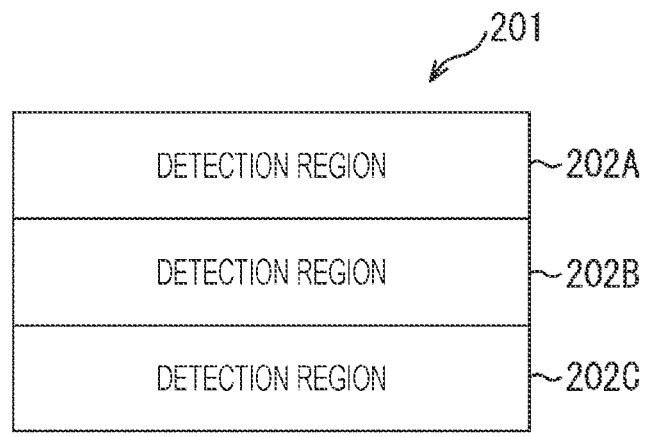
FIG. 10 is a diagram showing a first example configuration of the pixel region of the imaging device shown in FIG. 1.

FIG. 10 schematically shows an example configuration of the pixel region (the pixel array unit) of the imaging device 121.

A pixel region 201 is a region in which pixels 121a (not shown) having different incident angle directivities are two-dimensionally arranged in the row direction (horizontal direction) and the column direction (vertical direction). Note that all the pixels 121a do not need to have different incident angle directivities from one another, but some of the pixels 121a may have the same incident angle directivity. Also, not all the pixels 121a need to have an incident angle directivity.

Further, the pixel region 201 is divided into three equal regions in the column direction by detection regions 202A to 202C that are disposed in different rows from one another and extend in the row direction. Each of the detection regions 202A to 202C is used for restoration of a restored image and detection of flicker, as described later.

The detection regions 202A to 202C are regions that have the same light shielding pattern and the same incident angle directivity. That is, in the detection regions 202A to 202C, the arrangement of the pixels 121a (the number and positions of the pixels 121a) is the same, and the pixels 121a having the same light shielding pattern are arranged at the same positions (coordinates) in the respective regions. Accordingly, in the detection regions 202A to 202C, images of substantially the same object are captured at substantially the same object distance and angle of view.

Further, the imaging device 121 is of a rolling shutter type, and the pixel region 20 is sequentially exposed row by row. Specifically, exposure is sequentially started from the first row to the last row of the pixel region 201, reading of the detection signals of the respective pixels 121a is sequentially started from the first row to the last row of the pixel region 201, and the exposure period is shifted row by row.

Note that exposure of the pixel region 201 is not necessarily performed row by row, and may be performed for each plurality of rows. Specifically, exposure and reading may be performed for each plurality of rows in the pixel region 201, and the exposure period may be shifted for each plurality of rows.

For each detection region 202, the imaging device 121 then generates a plurality of detection images including detection signals output from the pixels 121a in each detection region 202, and outputs the detection images to the restoration unit 122 or the bus B1.

Note that, hereinafter, in a case where there is no need to distinguish the detection regions 202A to 202C from one another, the detection regions 202A to 202C will be referred to simply as the detection regions 202.

<Example Configuration of the Control Unit 123>

Figure 11:
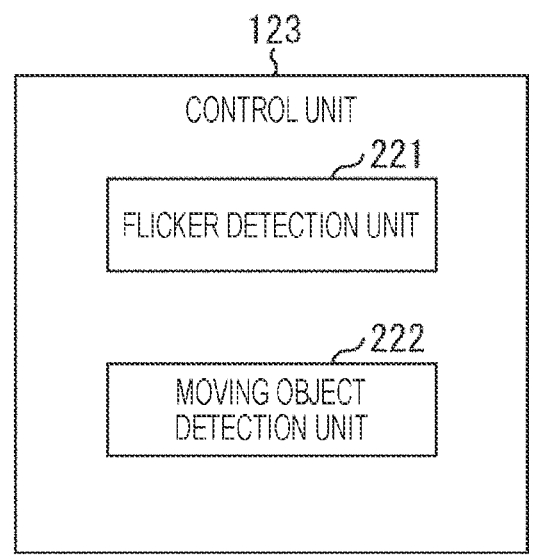
FIG. 11 is a block diagram showing an example functional configuration of the control unit shown in FIG. 1.

FIG. 11 is a block diagram showing an example configuration of some of the functions implemented by the control unit 123. The control unit 123 implements the functions of a flicker detection unit 221 and a moving object detection unit 222.

The flicker detection unit 221 performs flicker detection, on the basis of at least either a plurality of detection images corresponding to the respective detection regions 202 or a plurality of restored images restored from the respective detection images. The flicker detection unit 221 also detects a flicker region that is presumed to have flicker, on the basis of the luminance of the restored images. The flicker detection unit 221 supplies information indicating the flicker and the flicker detection result, and the like to the restoration unit 122.

The moving object detection unit 222 detects feature points of the plurality of restored images corresponding to the respective detection regions 202, and performs moving object detection, on the basis of the detected feature points. The moving object detection unit 222 supplies information indicating a moving object detection result to the recording/reproducing unit 129, and records the information on the recording medium 130 or outputs the information to another device via the communication unit 131 as necessary.

<First Embodiment of an Imaging Process>

Figure 12:
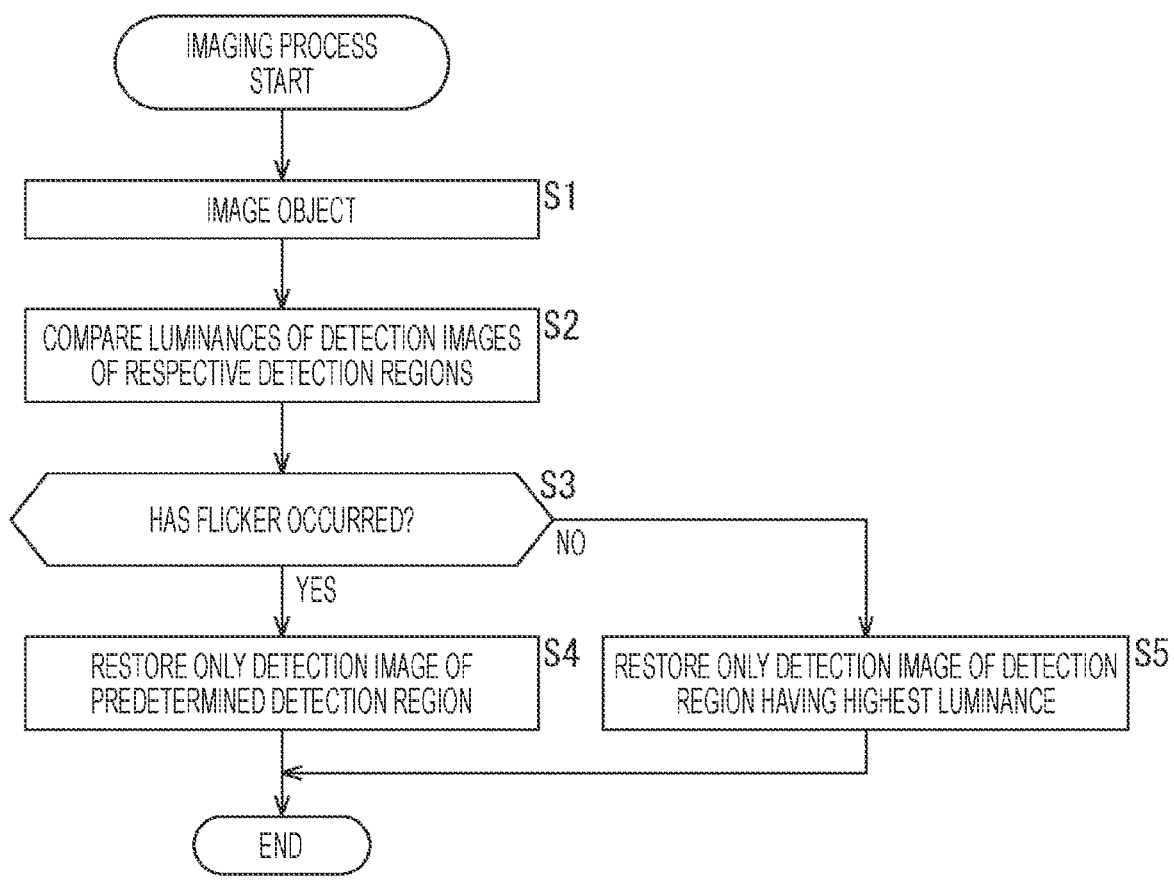
FIG. 12 is a flowchart for explaining a first embodiment of an imaging process to be performed by the imaging apparatus shown in FIG. 1.

Next, an imaging process to be performed by the imaging apparatus 101 is described, with reference to a flowchart shown in FIG. 12.

In step S1, the imaging device 121 images an object. As a result, detection signals indicating detection signal levels corresponding to the amounts of incident light from the object are output from the respective pixels 121a of the imaging device 121 having different incident angle directivities. The imaging device 121 also performs A/D conversion on the detection signals of the respective pixels 121a, generates a plurality of detection images including the detection signals of the respective pixels 121a of each detection region 202, and supplies the detection images to the flicker detection unit 221.

Since the imaging device 121 is of a rolling shutter type herein, the exposure varies with each detection region 202.

Figure 13:
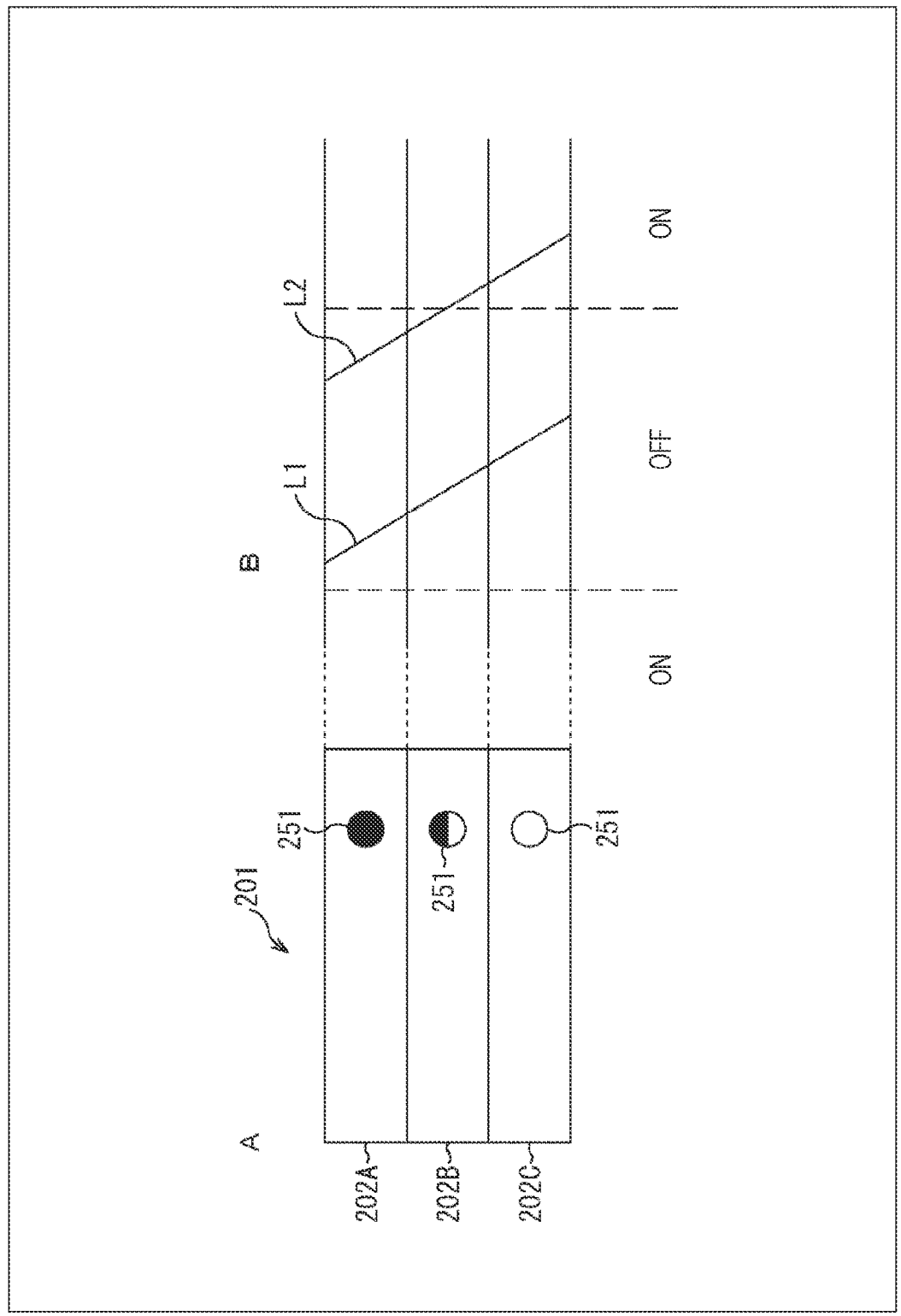
FIG. 13 is a diagram showing an example of exposure periods of the respective detection regions.

Specifically, A of FIG. 13 shows the pixel region 201 of the imaging device 121, and B of FIG. 1.3 shows the exposure periods of the respective rows in the pixel region 201. A straight line L1 in FIG. 13 indicates the exposure start timing of each row in the pixel region 201, and a straight line L2 indicates the read start timing of each row in the pixel region 201. Accordingly, the exposure period of each row in the pixel region 201 is the period between the straight line L1 and the straight line L2.

Further, A of FIG. 13 schematically shows a blinking object 251 (such as a lamp of a traffic light, for example). Hereinafter, as shown in A of FIG. 13, the object 251 is off during the exposure period of the detection region 202A, transits from the off-state to the on-state during the exposure period of the detection region 202B, and is on during the exposure period of the detection region 202C.

In step S2, the flicker detection unit 221 compares the luminances of the detection images of the respective detection regions 202. For example, the flicker detection unit 221 calculates the average luminance value of the detection image of each detection region 202, and calculates the differences in the average luminance value among the respective detection images.

In step S3, the flicker detection unit 221 determines whether or not there is flicker. For example, in a case where the difference in the average luminance value between the detection images of any combination is smaller than a predetermined threshold, which is where the difference in the luminance between the detection images of any combination is small, the flicker detection unit 221 determines that there is no flicker, and the process moves on to step S4.

In step S4, the restoration unit 122 restores only the detection image of a predetermined detection region 202. Specifically, the flicker detection unit 221 supplies the restoration unit 122 with the detection image of a predetermined detection region 202 (such as the detection region 202A, for example) among the detection images of the detection regions 202A to 202C.

The restoration unit 122 sets the distance to the object surface to be restored, which is the object distance. Note that any method can be adopted as the method for setting the object distance. For example, the restoration unit 122 sets an object distance that is input by a user via the input unit 124, or an object distance detected by the detection unit 125 as the distance to the object surface 102 to be restored.

Next, the restoration unit 122 reads, from the storage unit 128, the coefficient set group associated with the set object distance.

Next, the restoration unit 122 creates the simultaneous equations described above with reference to Equations (1) to (3), using the detection signal level of each pixel in the detection images supplied from the flicker detection unit 221, and the acquired coefficient set group. Next, the restoration unit 122 solves the created simultaneous equations, to calculate the light intensity of each point light source on the object surface corresponding to the set object distance. The restoration unit 122 then arranges the pixels having the pixel values corresponding to the calculated light intensities, in accordance with the layout of the respective point light sources on the object surface. By doing so, the restoration unit 122 generates a restored image in which an image of the object is formed.

Further, the restoration unit 122 performs demosaicing, γ correction, white balance adjustment, conversion into a predetermined compression format, and the like, on the restored image as necessary. The restoration unit 122 also supplies the restored image to the display unit 127 to display the restored image, supplies the restored image to the recording/reproducing unit 129 to record the restored image on the recording medium 130, or outputs the restored image to another device via the communication unit 131, as necessary.

After that, the imaging process comes to an end.

In a case where, in step S3, the difference in the average luminance value between the detection images of at least one combination is equal to or larger than the predetermined threshold, which is a case where the difference in the luminance between the detection images of at least one combination is large, for example, on the other hand, the flicker detection unit 221 determines that there is flicker, and the process moves on to step S5.

For example, in the example shown in A of FIG. 13, the blinking state of the object 251 varies among the exposure periods of the detection regions 202A to 202C as described above. Therefore, the differences in luminance become larger among the detection images of the detection regions 202A to 202C, and it is determined that there is flicker.

In step S5, the restoration unit 122 restores only the detection image of the detection region having the highest luminance. Specifically, the flicker detection unit 221 selects the detection image having the highest average luminance value from among the detection images of the detection regions 202A to 2020, and supplies the selected detection image to the restoration unit 122.

For example, in the example shown in A of FIG. 13, the detection image of the detection region 202C captured (exposed) when the object 251 is on is selected from among the detection images of the detection regions 202A to 202C.

The restoration unit 122 restores the detection image selected by the flicker detection unit 221 by a process similar to that in step S4 described above.

After that, the imaging process comes to an end.

In this manner, flicker can be reduced. For example, in the example shown in A of FIG. 13, the detection image of the detection region 202C captured when the object 251 is on is restored. Thus, the blinking object 251 can be detected without fail.

For example, in a case where the lamp of a traffic light is formed with a light emitting diode (LED), the lamp actually blinks even while the lamp is on. Therefore, flicker occurs, and a conventional imaging apparatus might fail to detect the lamp in an on-state in some cases.

On the other hand, the imaging apparatus 101 can restore a restored image from a detection image captured when the lamp of the traffic light is on, and thus, failures in detection of a lamp in an on-state can be reduced. As a result, it becomes possible to achieve safe automated driving by using restored images in controlling the automated driving, for example.

The imaging apparatus 101 also performs flicker detection at the stage of detection images prior to restoration, and thus, flicker detection can be quickly performed.

Further, as only the restored image of one detection region 202 is restored, the amount of calculation can be reduced, and the frame rate (sampling period) can be raised, for example.

<Second Embodiment of an Imaging Process>

Figure 14:
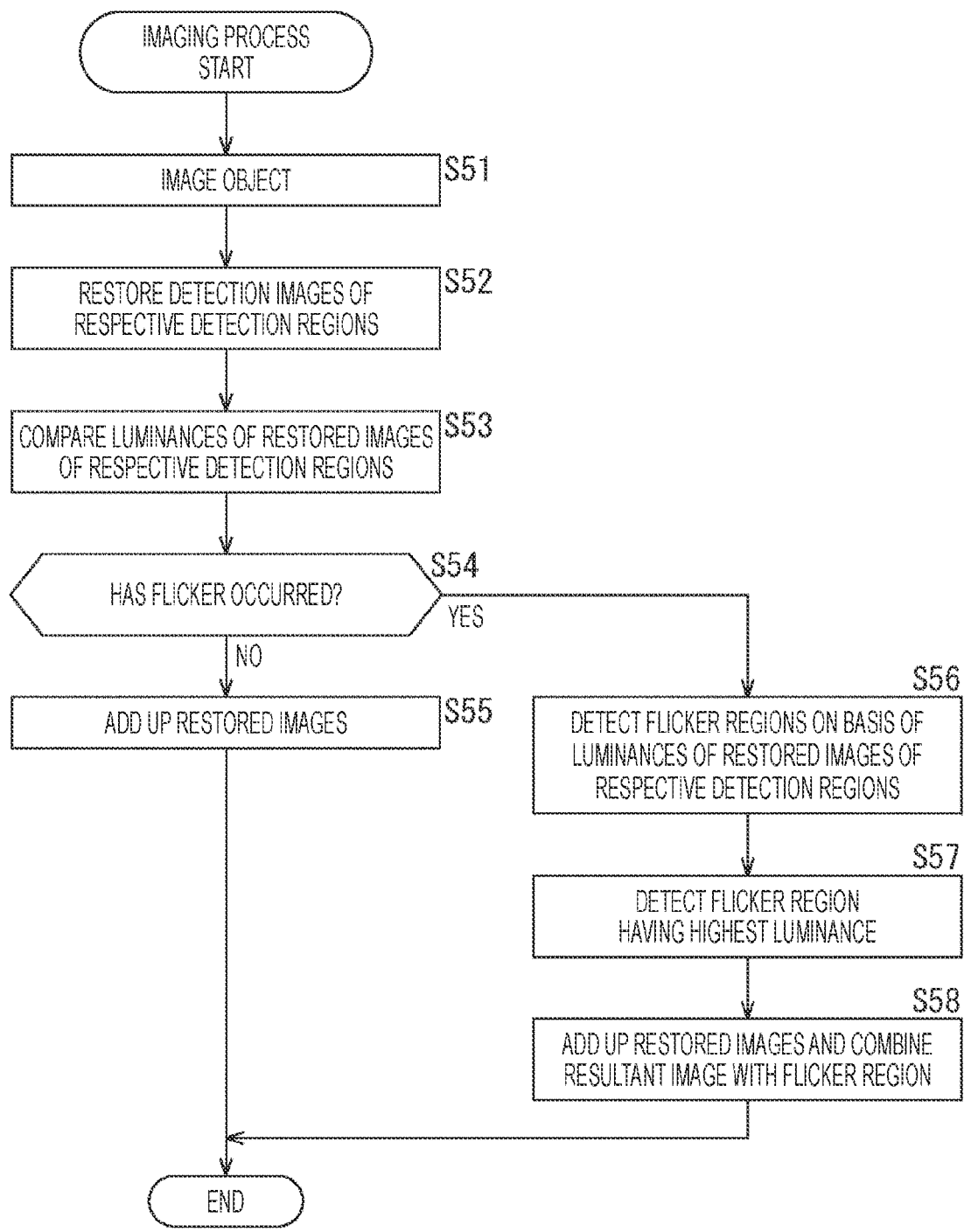
FIG. 14 is a flowchart for explaining a second embodiment of an imaging process to be performed by the imaging apparatus shown in FIG. 1.

Next, a second embodiment of an imaging process to be performed by the imaging apparatus 101 is described, with reference to a flowchart shown in FIG. 14.

In step S51, object imaging is performed in a manner similar to the process in step S1 in FIG. 12. the imaging device 121 then supplies the detection image of each detection region 202 to the restoration unit 122.

In step S52, the restoration unit 122 restores the detection image of each detection region 202 by a process similar to step S4 in FIG. 12. The restoration unit 122 supplies the restored image of each detection region 202 to the flicker detection unit 221.

In step S53, the flicker detection unit 221 compares the luminances of the restored images of the respective detection regions 202. For example, the flicker detection unit 221 calculates the average luminance value of the restored image of each detection region 202, and calculates the differences in the average luminance value among the respective restored images.

In step S54, the flicker detection unit 221 determines whether or not there is flicker. For example, in a case where the difference in the average luminance value between the restored images of any combination is smaller than a predetermined threshold, which is where the difference in the luminance between the restored images of any combination is small, the flicker detection unit 221 determines that there is no flicker, and the process moves on to step S55.

In step S55, the restoration unit 122 adds up the restored images. Specifically, the flicker detection unit 221 notifies the restoration unit 122 that there is no flicker. The restoration unit 122 adds up the restored image by adding up the pixel values of the pixels at the same position in the restored images of the respective detection regions 202.

Further, the restoration unit 122 performs demosaicing, γ correction, white balance adjustment, conversion into a predetermined compression format, and the like, on the combined restored image, as necessary. The restoration unit 122 also supplies the restored image to the display unit 127 to display the restored image, supplies the restored image to the recording/reproducing unit 129 to record the restored image on the recording medium 130, or outputs the restored image to another device via the communication unit 131, as necessary.

After that, the imaging process comes to an end.

In a case where, in step S54, the difference in the average luminance value between the restored images of at least one combination is equal to or larger than the predetermined threshold, which is a case where the difference in the luminance between the restored images of at least one combination is large, for example, on the other hand, the flicker detection unit 221 determines that there is flicker, and the process moves on to step S56.

In step S56, the flicker detection unit 221 detects flicker regions, on the basis of the luminance of the restored image of each detection region 202. For example, the flicker detection unit 221 compares the luminances of the restored images of the respective detection regions 202 pixel by pixel, and extracts pixels having a difference in luminance equal to or larger than the predetermined threshold. Next, the flicker detection unit 221 performs processing such as removal of pixels whose luminance fluctuates due to noise from the extracted pixels, and then detects the regions formed with the extracted pixels as flicker regions. As a result, the region in which the luminance greatly varies among the restored images of the respective detection regions 202 is detected as flicker regions.

Figure 15:
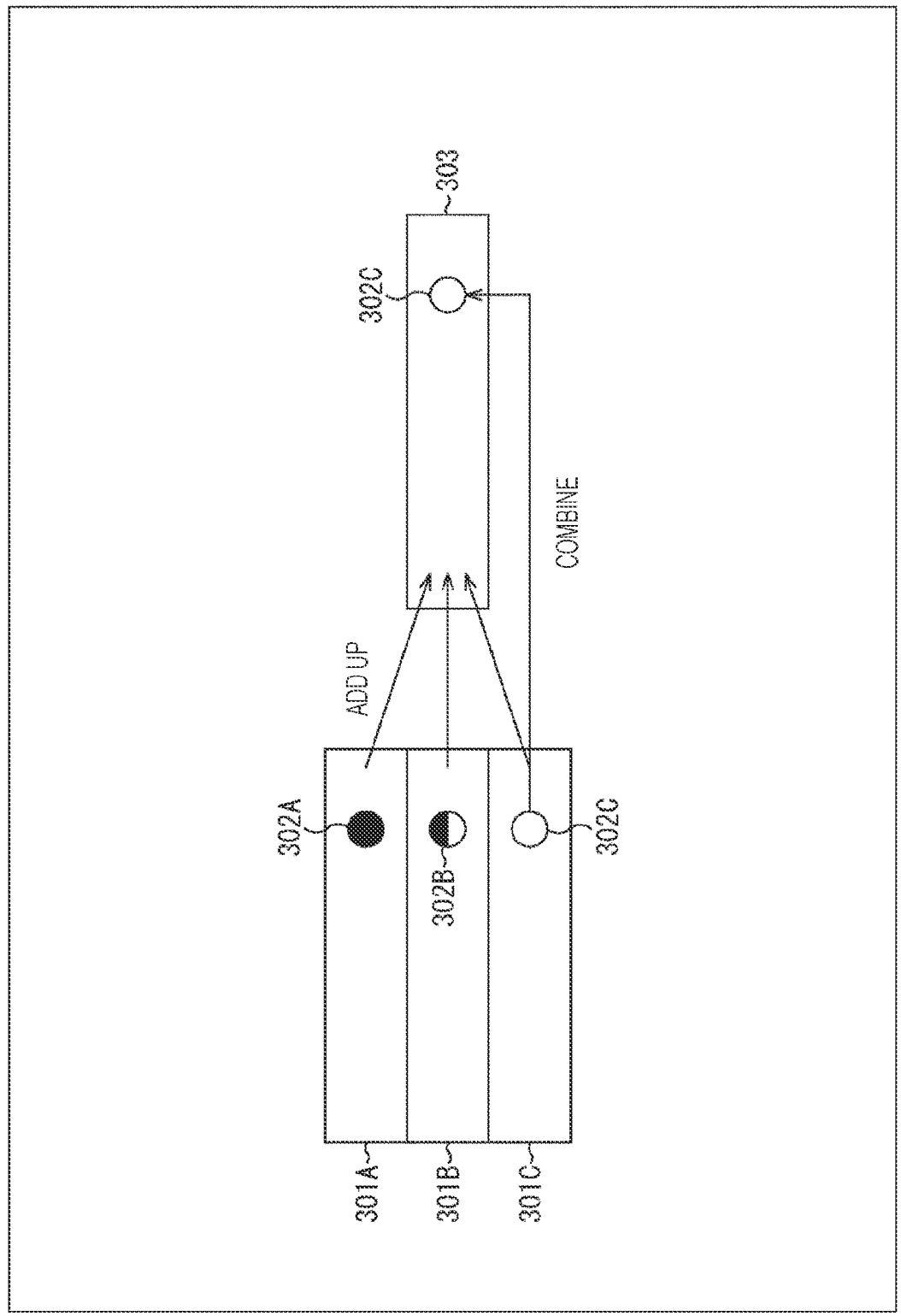
FIG. 15 is a diagram for explaining a method of adding up and combining restored images.

For example, the left side in FIG. 15 shows an example of restored images 301A to 301C restored from the detection images of the detection regions 202; to 202C captured in the state shown in A of FIG. 13. The object 251 in FIG. 13 is captured in regions 302A to 302C in the restored images 301A to 301C.

In this case, in the restored images 301A to 301C, the regions 302A to 302C having large changes in luminance are detected as flicker regions.

In step S57, the flicker detection unit 221 detects the flicker region having the highest luminance. For example, the flicker detection unit 221 calculates the average luminance value of the flicker region in the restored image of each detection region 202. The flicker detection unit 221 then detects the flicker region having the highest average luminance value among the flicker regions of the respective restored images.

For example, in the example shown on the left side in FIG. 15, the flicker region 302C of the restored image 301C is detected as the flicker region having the highest luminance.

Note that, in a case where there is a plurality of flicker regions in each restored image (such as a case where there is a plurality of blinking objects, for example), the luminances of the respective flicker regions are compared with one another, and the flicker region having the highest luminance is detected. Therefore, the restored image from which the flicker region having the highest luminance is detected might vary with each flicker region or with each blinking object) in some cases.

In step S58, the flicker detection unit 221 adds up the restored images and combines the flicker regions. Specifically, the flicker detection unit 221 adds up the pixel values of the pixels at the same positions in the regions excluding the flicker regions in the respective restored images. The flicker detection unit 221 also combines the image of the flicker region having the highest luminance detected by the process in step S57 with the restored image obtained by adding up the pixel values.

For example, in the example shown in FIG. 15, the pixel values of the pixels at the same positions in the region excluding the region 302A in the restored image 301A, the region excluding the region 302B in the restored image 301B, and the region excluding the region 302C of the restored image 301C are added up. Further, the image in the flicker region 302C having the highest luminance among the flicker regions 302A to 302C is combined with the restored image after the addition. As a result, a restored image 303 is generated.

Further, the restoration unit 122 performs demosaicing, γ correction, white balance adjustment, conversion into a predetermined compression format, and the like, on the obtained restored image, as necessary. The restoration unit 122 also supplies the restored image to the display unit 127 to display the restored image, supplies the restored image to the recording/reproducing unit 129 to record the restored image on the recording medium 130, or outputs the restored image to another device via the communication unit 131, as necessary.

After that, the imaging process comes to an end.

Note that the restored images of the respective detection regions 202 are images obtained by capturing the same object at the same object distance and angle of view substantially at the same time. Accordingly, in a case where there is no flicker, the restored images of the respective detection regions 202 are added up, to increase image quality. For example, noise can be removed, or a high resolution can be a achieved In a case where there is flicker, on the other hand, pixels are added up to increase image quality in a region having no flicker. Further, in a region having flicker, an image of the region having the highest luminance is generated from the respective restored images. As a result, the image quality of a restored image is increased, and flicker can be reduced.

Figure 16:
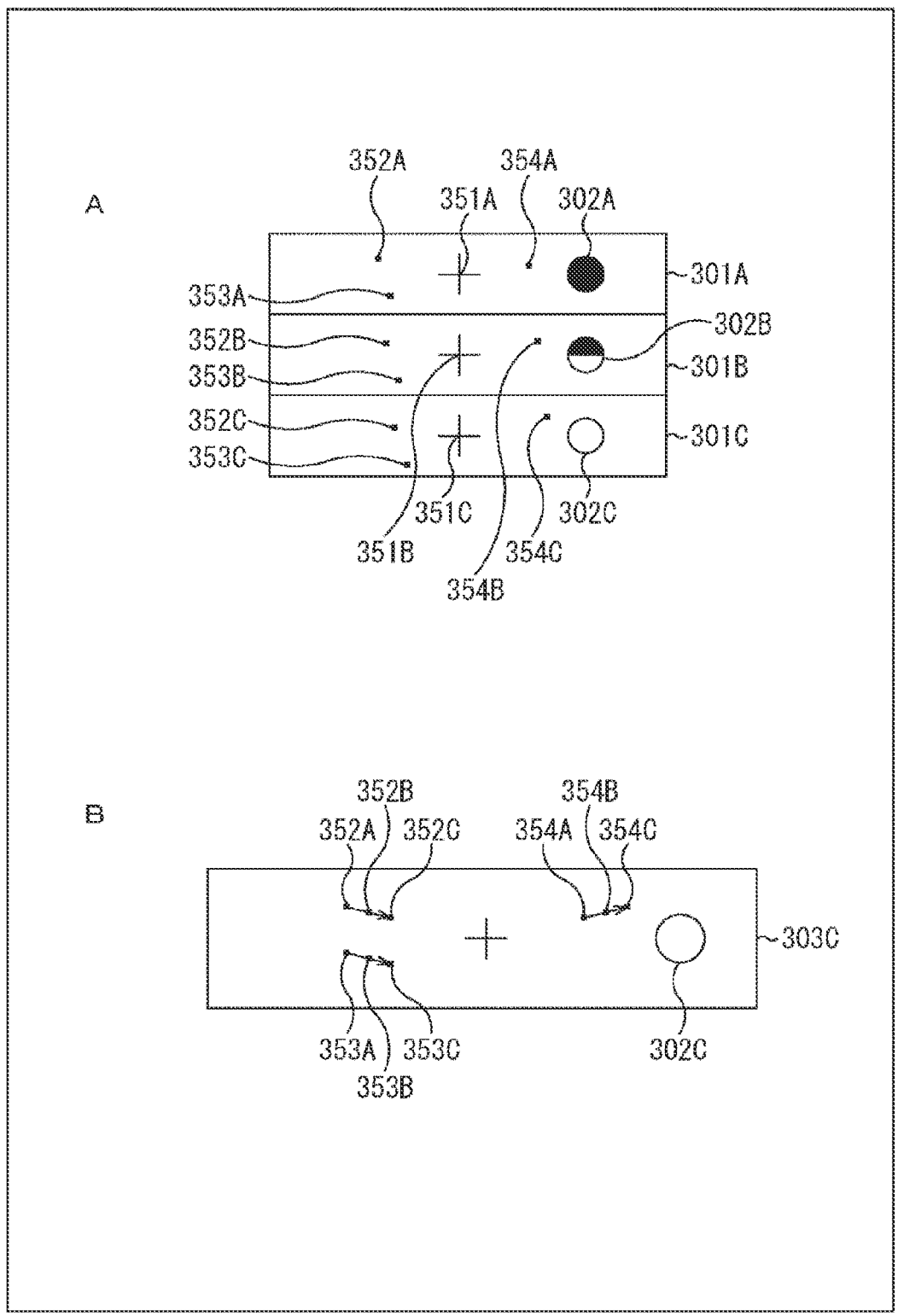
FIG. 16 is a diagram for explaining a moving object detection method.

Note that, as shown in FIG. 16, it is possible to detect a moving object (an optical flow) by detecting feature points in the restored images 301A to 301C, for example.

For example, as shown in A of FIG. 16, the moving object detection unit 222 detects a vanishing point 351A and feature points 352A to 354A in the restored image 301A, detects a vanishing point 351B and feature points 352B to 354B in the restored image 301B, and detects a vanishing point 351C and feature points 352C to 354C in the restored image 301C. Note that the feature points 352A to 352C correspond to one another, the feature points 353A to 353C correspond to one another, and the feature points 354A to 354C correspond to one another.

Further, as shown in an enlarged manner in B of FIG. 16, for example, the moving object detection unit 222 generates an optical flow on the basis of the feature points 352A to 352C in the restored image 303 after the addition and combining of the restored images 301A to 301C, and performs moving object detection. Likewise, in the restored image 303, the moving object detection unit 222 generates an optical flow on the basis of the feature points 353A to 353C and performs moving object detection, and generates an optical flow on the basis of the feature points 354A to 354C and performs moving object detection.

<Flicker Reducing Effect of Pixel Region Dividing>

Figure 17:
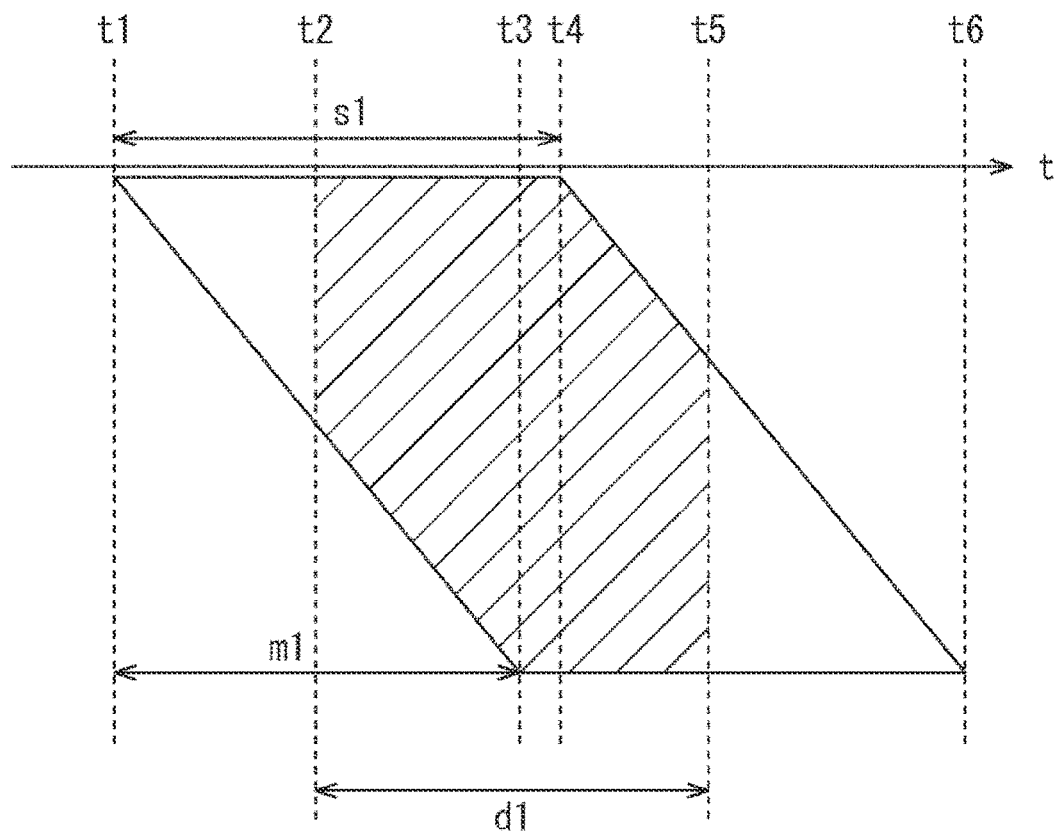
FIG. 17 is a diagram for explaining a flicker reducing effect to be achieved by dividing a pixel region.
Figure 18:
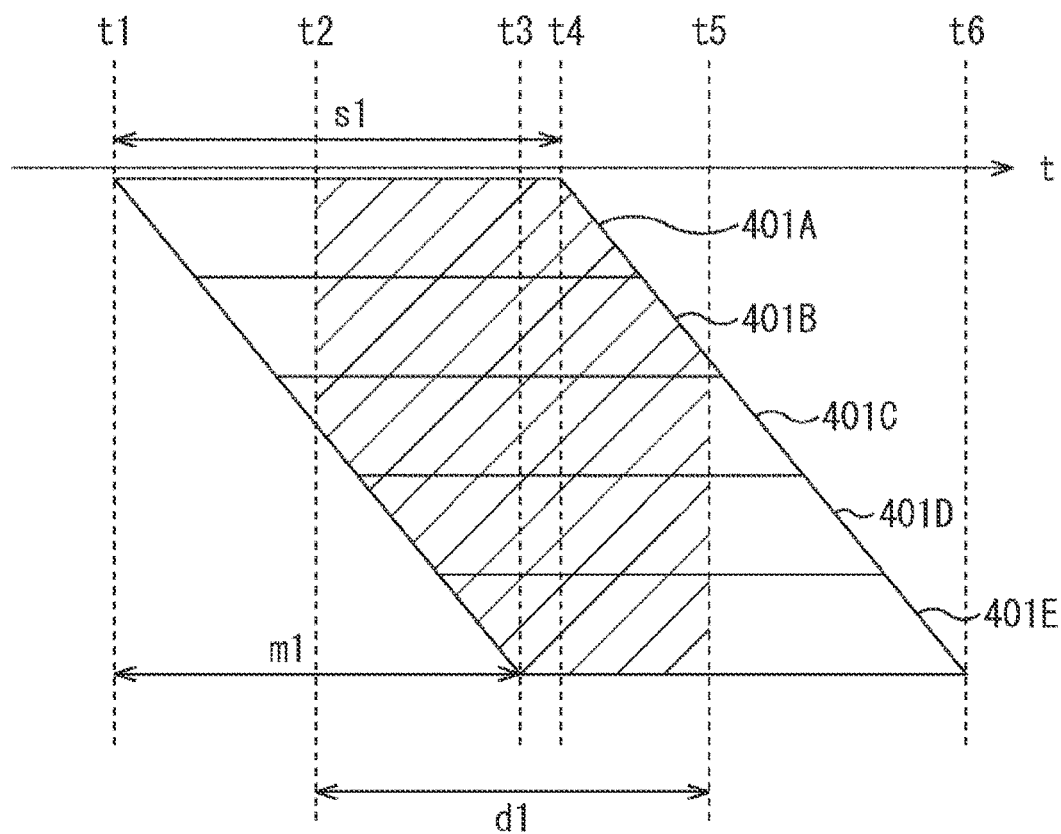

Next, the flicker reducing effect to be achieved by dividing the pixel region is described, with reference to FIGS. 17 and 18. Note that FIG. 17 shows an example of the exposure period in a case where the pixel region is not divided, and FIG. 18 shows an example of the exposure periods in a case where the pixel region is divided into five detection regions 401A to 401E.

Note that, hereinafter, in a case where there is no need to distinguish the detection regions 401A to 401E from one another, the detection regions 401A to 401E will be referred to simply as the detection regions 401.

In the examples shown in FIGS. 17 and 18, the exposure period of the entire pixel region is the same. Specifically, the exposure of the first row in the pixel region is started at time t1, and the exposure of the last row in the pixel region ends at time t3. Further, at time t4, reading of the detection signal of the first row in the pixel region is started. At time t6, reading of the detection signal of the last row in the pixel region is finished. Accordingly, an exposure time s1 is calculated as (time t4−time t1), and a curtain speed m1 is calculated as (time t3−time t1).

Here, a case where an object that blinks (hereinafter referred to as the blinking object) such as a lamp of a traffic light formed with an LED is imaged is described, for example.

The blinking object is turned off at time t2, and is turned on at time t5, for example. In this case, the periods indicated by hatching in the exposure periods shown in FIGS. 17 and 16 are the periods overlapping the lights-out period d1 of the blinking object. Further, the length of the Lights-out period d1 is calculated as (time t5−time t2).

For example, as shown in FIG. 17, in a case where the pixel region is not divided, the variation in the intensity of incident light from the blinking object is greater between the respective rows in the pixel region. For example, in the rows near the center of the pixel region, light from the blinking object hardly enters over substantially the entire exposure period. In the rows near the ends of the pixel region, light from the blinking object enters during almost a half of the exposure period.

Note that, the lower the curtain speed m1, the greater the variation in the intensity of incident light from the blinking object in each row.

Meanwhile, the simultaneous equations described above with reference to Equations (1) to (3) are created on the assumption that the object is stationary and does not change during imaging. Therefore, when the difference in the intensity of incident light from the blinking object becomes larger between the respective rows, inconsistency appears in the relationship between the simultaneous equations, and it becomes difficult to solve the simultaneous equations. As a result, an error in a solution to the simultaneous equations might become larger, the image quality of a restored image might be degraded, or the accuracy of detection of the blinking object might become lower, for example.

Note that it is possible to solve the simultaneous equations more accurately by taking into account the relationship between the curtain speed m1 and the lighting time of the blinking object, for example. However, the relationship between the curtain speed m1 and the lighting time of the blinking object needs to be predicted in advance, and the amount of calculation will become larger, which is not very realistic. Particularly, in a case where a restored image is to be used for automated driving or the like, priority is put on real-time properties, and therefore, practicality becomes poorer.

On the other hand, as shown in FIG. 18, as the pixel region is divided, the curtain speed in each detection region 401 becomes higher and reaches m1/5. Accordingly, the variation in the intensity of incident light from the blinking object in each detection region 401 is smaller than in the case where the pixel region is not divided.

As a result, compared with the case in which the pixel region is not divided, it is easier to solve the simultaneous equations, the image quality of the restored image restored from each detection region 401 is higher, and the accuracy of detection of the blinking object also higher.

<<2. Modifications>>.

The following is a description of modifications of the above described embodiment of the present technology.

<Modifications Relating to Detection Regions>

The number of divisions of the pixel region described above, which is the number of detection regions, is merely an example, and can be changed to any appropriate number.

Also, the light shielding patterns in the respective detection region, which are the incident angle directivities of the respective detection regions, do not need to be completely the same. For example, the arrangement of some of the pixels may vary among the respective detection regions, or the light shielding pattern of some of the pixels 121a at the same position may vary.

Further, in the above description, examples in which (the pixels in) each detection region is used for restoring a restored image has been described. However, as shown in FIG. 19, for example, the detection regions may differ from the restoration regions, to be used for restoring restored images.

Figure 19:
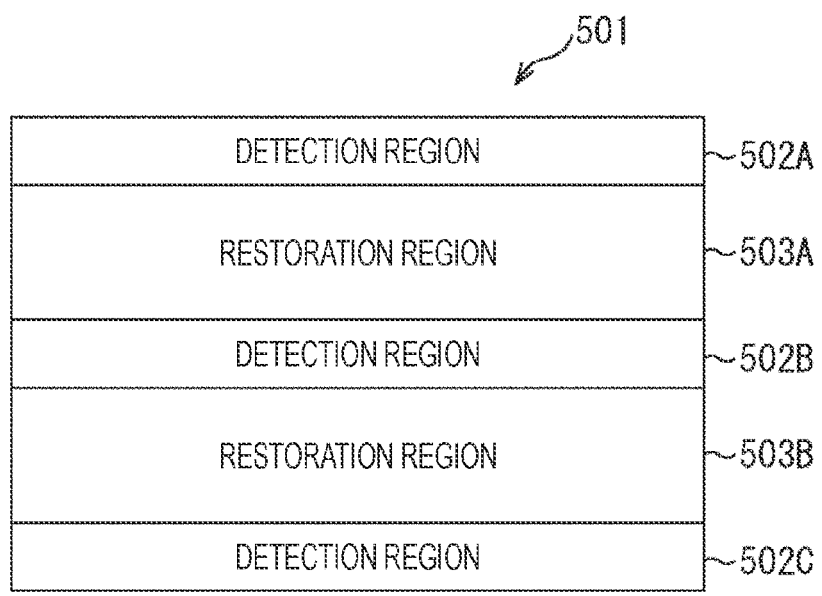
FIG. 19 is a diagram showing a second example configuration of the pixel region.

A pixel region 501 shown in FIG. 19 is divided into detection regions 502A to 502C, a restoration region 503A, and a restoration region 503B in the column direction (vertical direction). The detection regions 502A to 502C, the restoration region 503A, and the restoration region 503B are disposed in different rows from one another in the pixel region 501, and extend in the row direction (horizontal direction). Further, the detection regions and the restoration regions are alternately arranged.

The detection regions 502A to 502C are used only for detecting flicker, and are not used for restoring restored images.

On the other hand, the restoration region 503A and the restoration region 503B are used only for restoring restored images, and are not used for detecting flicker. Also, individual detection images are generated from the restoration region 503A and the restoration region 503B, and an individual restored image is restored from each detection image.

With this arrangement, the number of pixels in the detection regions 502A to 502C can be reduced, and the flicker detection time can be shortened in each of the imaging processes shown in FIGS. 12 and 14 described above, for example.

Note that the number of detection regions and the number of restoration regions can be changed.

Also, the number of rows in a detection region can be set at any appropriate number, and may be one, for example.

Further, the respective detection regions are only required to be disposed in different rows as a whole, and may partially overlap one another. However, it is preferable that the respective detection regions do not overlap one another, and the number of overlapping rows is preferably minimized in a case where there are overlaps.

<Modifications Relating to a Restoration Process>

In the above described restoration process, a restored image corresponding to a predetermined object distance is restored immediately after detection images are captured. However, a restoration process may not be performed immediately. Instead, a restored image may be restored with the use of detection images at desired timing after detection images are recorded on the recording medium 130, or are output to another device via the communication unit 131, for example. In this case, the restored image may be restored by the imaging apparatus 101 or by some other device. For example, a restored image may be obtained by solving simultaneous equations created with a coefficient set group corresponding to a desired object distance and angle of view. In this manner, a restored image corresponding to an object surface at a desired object distance and angle of view can be obtained, and thus, refocusing and the like can be achieved.

Further, it is also possible to achieve an autofocus function, like an imaging apparatus that uses an imaging lens. For example, it is possible to achieve an autofocus function by determining the optimum object distance on the basis of a restored image by a hill climbing method similar to a contrast auto focus (AF) method.

<Modifications Relating to the Configuration of the System>

For example, some or all of the processes to be performed by the signal processing control unit 111 of the imaging apparatus 101 may be performed by an external device. For example, flicker detection and restoration of restored images may be performed by an external device.

<Modifications Relating to the Imaging Device 121>

Figure 20:
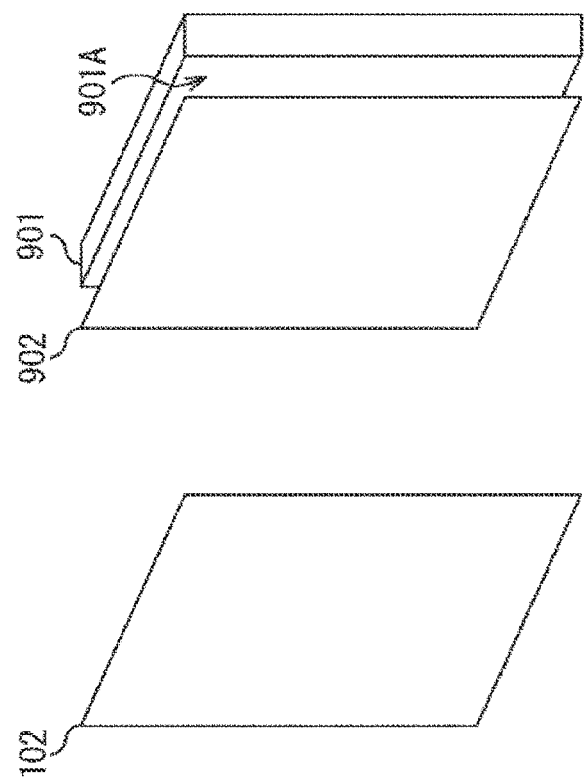
FIG. 20 is a diagram showing a modification of the imaging device.

FIG. 4 shows an example in which the light shielding films 121b are used as modulation elements, or combinations of photodiodes that contribute to outputs are changed, so that different incident angle directivities are provided for the respective pixels. However, according to the present technology, an optical filter 902 covering the light receiving surface of an imaging device 901 may be used as a modulation element so that incident angle directivities are provided for the respective pixels, as shown in FIG. 20, for example.

Specifically, the optical filter 902 is disposed at a predetermined distance from the light receiving surface 901A of the imaging device 901 so as to cover the entire surface of the light receiving surface 901A. Light from the object surface 102 is modulated by the optical filter 902, and then enters the light receiving surface 901A of the imaging device 901.

Figure 21:
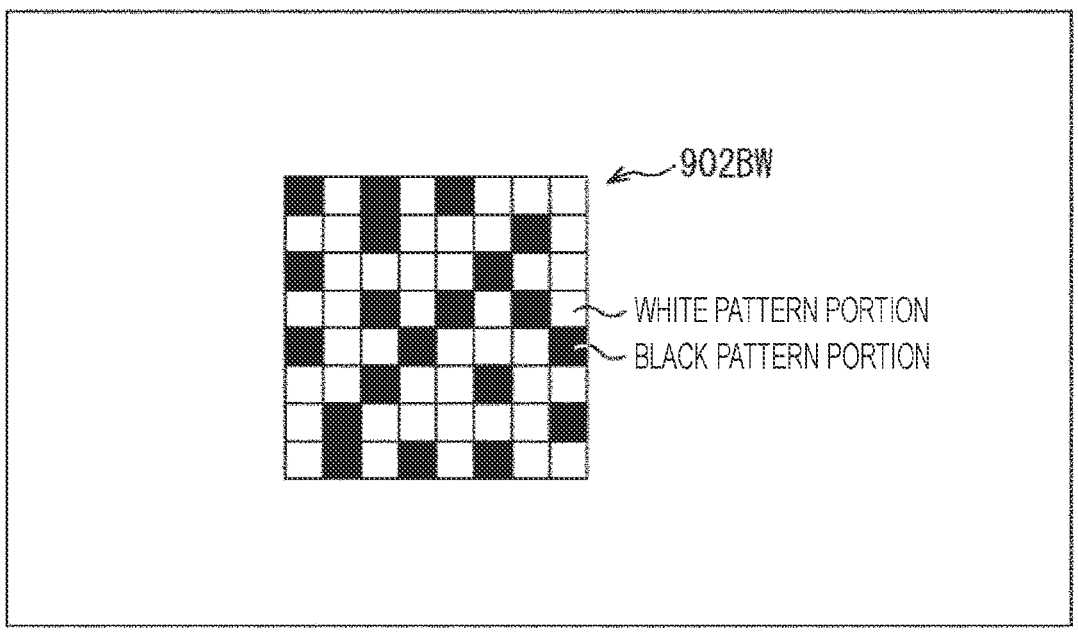
FIG. 21 is a diagram showing a modification of the imaging device.

For example, an optical filter 902BW having a black-and-white lattice pattern shown in FIG. 21 can be used as the optical filter 902. In the optical filter 902BW, white pattern portions that transmit light and black pattern portions that block light are randomly arranged. The size of each pattern is set independently of the size of the pixels of the imaging device 901.

Figure 22:
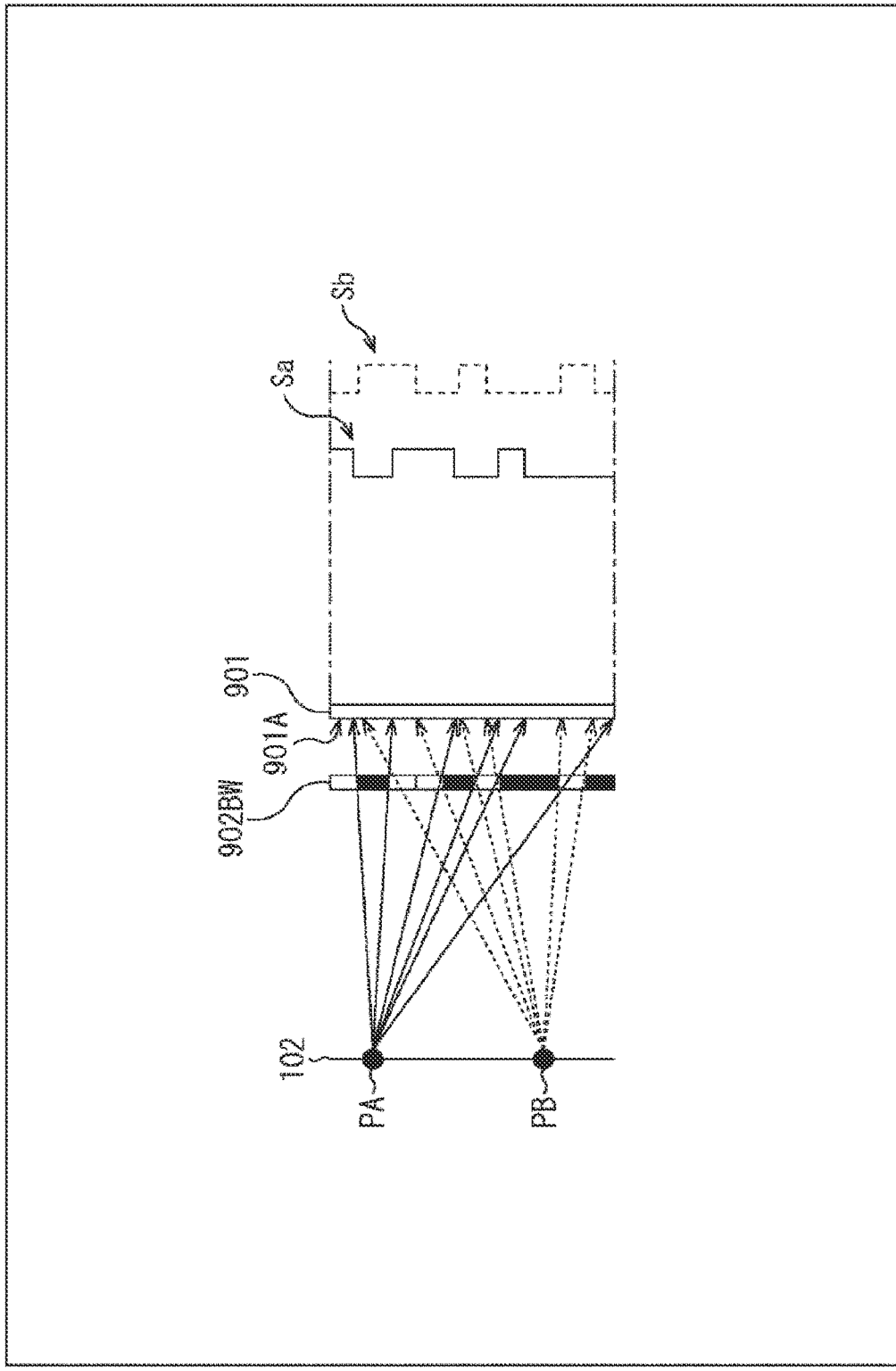
FIG. 22 is a diagram showing a modification of the imaging device.

FIG. 22 shows the light-receiving sensitivity characteristics of the imaging device 901 with respect to light from a point light source PA and a point light source PB on the object surface 102 in a case where the optical filter 902BW is used. Light from each of the point light source PA and the point light source PB is modulated by the optical filter 902BW, and then enters the light receiving surface 901A of the imaging device 901.

The light-receiving sensitivity characteristics of the imaging device 901 with respect to light from the point light source PA are like a waveform Sa, for example. That is, shadows are formed by the black pattern portions of the optical filter 902BW, and therefore, a grayscale pattern is formed in the image on the light receiving surface 901A with respect to the light from the point light source PA. Likewise, the light-receiving sensitivity characteristics of the imaging device 901 with respect to light from the point light source PB are like a waveform. Sb, for example. That is, shadows are formed by the black pattern portions of the optical filter 902BW, and therefore, a grayscale pattern is formed in the image on the light receiving surface 901A with respect to the light from the point light source PB.

Note that light from the point light source PA and light from the point light source PB have different incident angles with respect to the respective white pattern portions of the optical filter 902BW, and therefore, differences are generated in the appearance of the grayscale pattern on the light receiving surface. Accordingly, each pixel of the imaging device 901 has an incident angle directivity with respect to each point light source on the object surface 102.

Details of this method are disclosed by M. Salman Asif and four others in "Flatcam: Replacing lenses with masks and computation", "2015 IEEE international Conference on Computer Vision Workshop (ICCVW)", 2015, pp. 663-666, for example.

Figure 23:
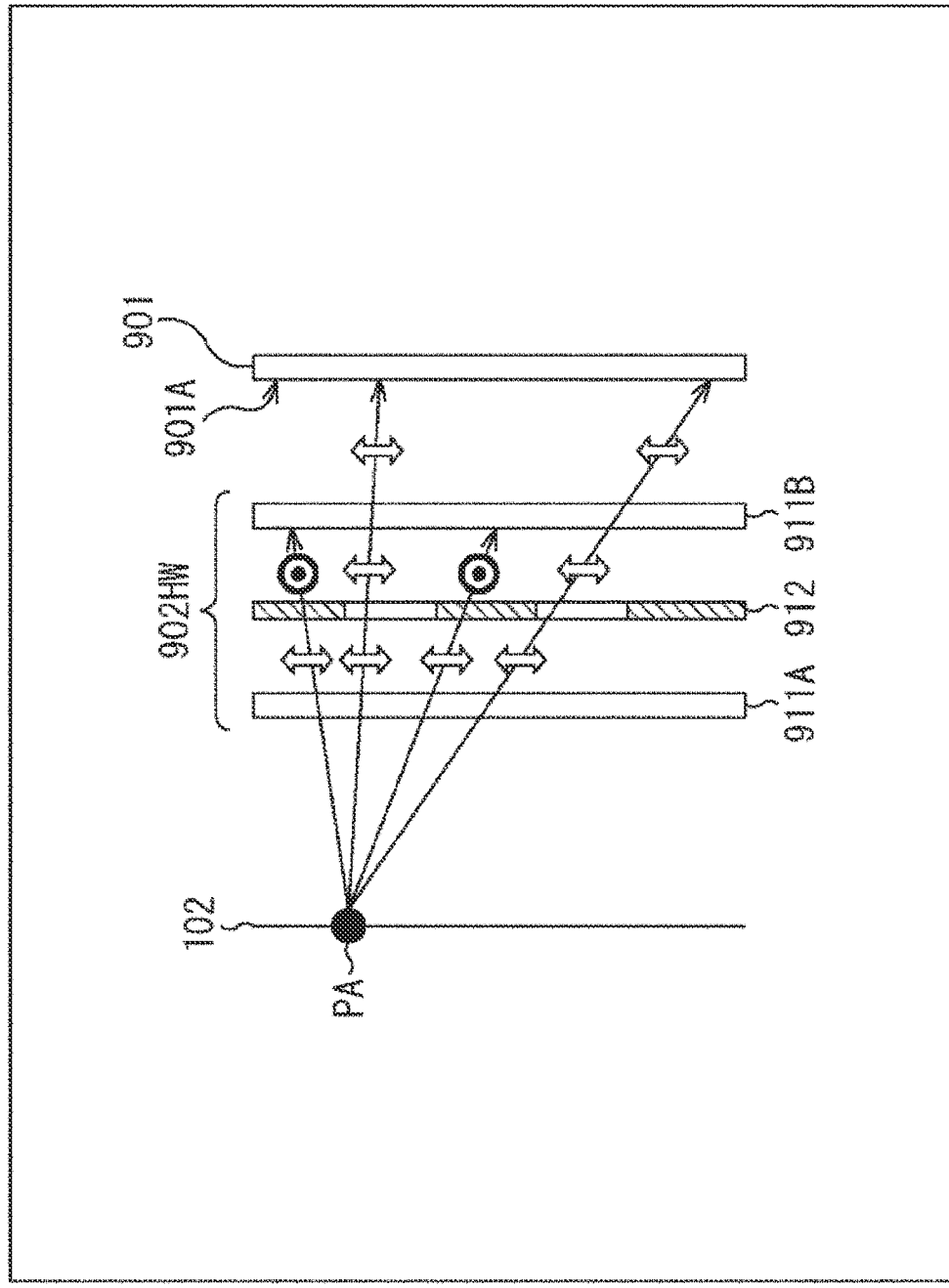
FIG. 23 is a diagram showing a modification of the imaging device.

Note that an optical filter 902HW shown in FIG. 23 may be used, instead of the black pattern portions of the optical filter 902BW. The optical filter 902HW includes a linearly polarizing element 911A and a linearly polarizing element 911B that have the same polarizing direction, and a ½ wavelength plate 912. The ½ wavelength plate 912 is interposed between the linearly polarizing element 911A and the linearly polarizing element 911B. Instead of the black pattern portions of the optical filter 902BW, polarizing portions indicated by shaded portions are provided in the ½ wavelength plate 912, and the white pattern portions and the polarizing portions are randomly arranged.

The linearly polarizing element 911A transmits only light in a predetermined polarizing direction among substantially unpolarized light beams emitted from the point light source PA. In the description below, the linearly polarizing element 911A transmits only light in a polarizing direction parallel to the drawing. Of the polarized light beams transmitted through the linearly polarizing element 911A, polarized light transmitted through the polarizing portions of the ½ wavelength plate 912 changes its polarizing direction to a direction perpendicular to the drawing, as the polarization plane is rotated. On the other hand, of the polarized light beams transmitted through the linearly polarizing element 911A, polarized light transmitted through the white pattern portions of the ½ wavelength plate 912 does not change its polarizing direction that remains parallel to the drawing. The linearly polarizing element 911B then transmits the polarized light transmitted through the white pattern portions, but hardly transmits the polarized light transmitted through the polarizing portions. Therefore, the light amount of the polarized light transmitted through the polarizing portions becomes smaller than that of the polarized light transmitted through the white pattern portions. As a result, a grayscale pattern substantially similar to that in the case with the optical filter BW is formed on the light receiving surface 901A of the imaging device 901.

Figure 24:
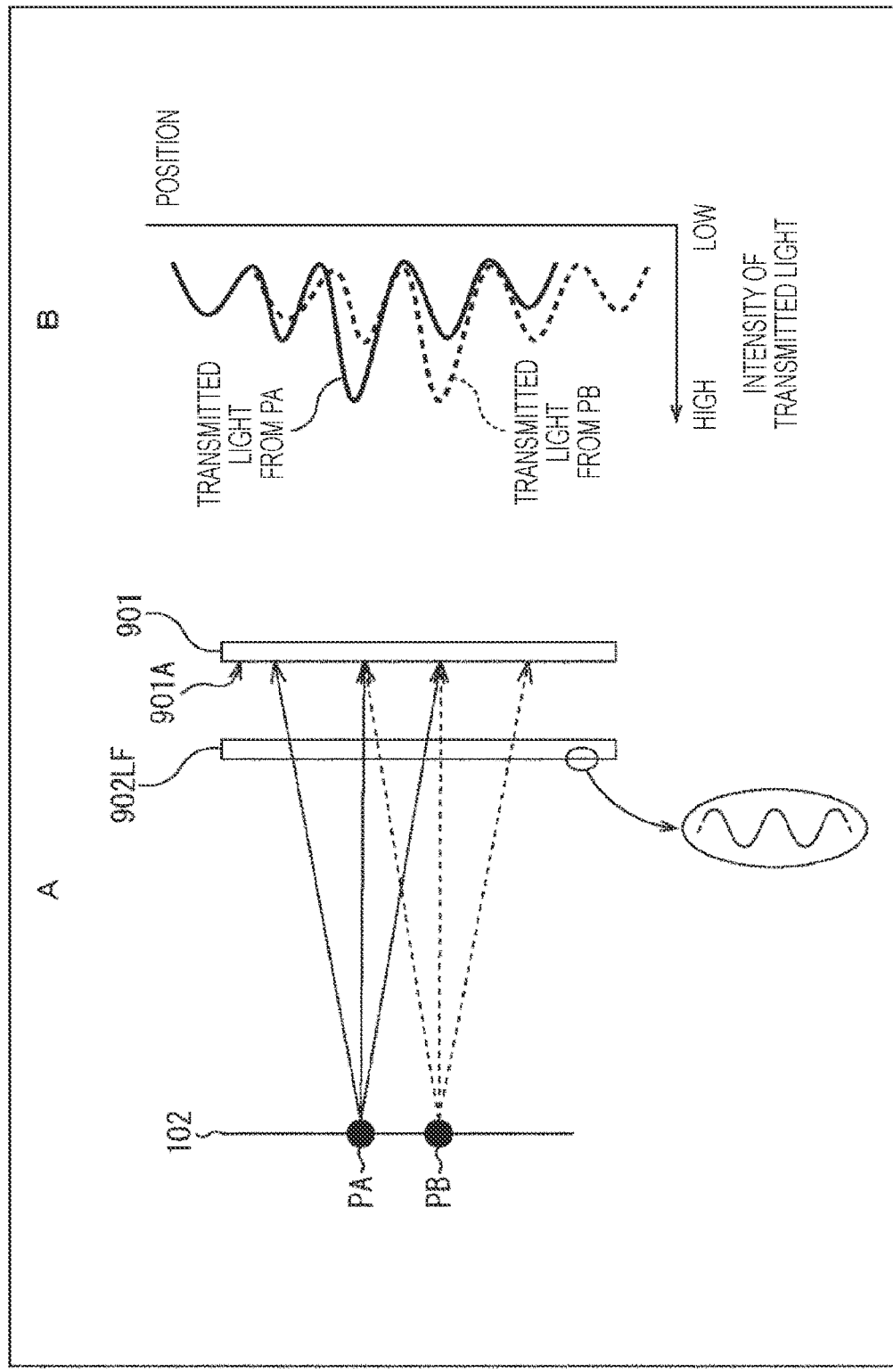
FIG. 24 is a diagram showing a modification of the imaging device.

Further, as shown in A of FIG. 24, an optical interference mask can be used as an optical filter 9021F. Light emitted from the point light sources PA and PB on the object surface 102 is emitted onto the light receiving surface 901A of the imaging device 901 via the optical filter 902LF. As shown in an enlarged view in a lower portion of A of FIG. 24, the light incident face of the optical filter 902LF has irregularities of a size similar to the size of a wavelength, for example. Also, the optical filter 902LF maximizes transmission of light of a specific wavelength emitted from the vertical direction. When the change in the incident angle of light of the specific wavelength emitted from the point light sources PA and PB on the object surface 102 with respect to the optical filter 9021F (or the inclination with respect to the vertical direction) becomes greater, the optical path length changes. Here, when the optical path length is an odd multiple of the half wavelength, light beams weaken each other. When the optical path length is an even multiple of the half wavelength, light beams strengthen each other. That is, as shown in B of FIG. 24, the intensity of transmitted light of the specific wavelength emitted from the point light sources PA and PB and transmitted through the optical filter 902LF is modulated in accordance with the incident angle with respect to the optical filter 902LF, and then enters the light receiving surface 901A of the imaging device 901. Accordingly, the detection signal output from each pixel of the imaging device 901 is a signal obtained by combining the light intensities after modulation of the respective point light sources for each pixel.

Details of this method are disclosed in JP 2016-510910 W mentioned above, for example.

<Other Modifications>

The present technology can also be applied to an imaging apparatus and an imaging device that images light of a wavelength other than visible light, such as infrared light. In this case, a restored image is not an image from which the user can visually recognize the object, but an image from which the user cannot visual recognize the object. In This case, the present technology is also used to increase the quality of a restored image in an image processing apparatus or the like that can recognize the object. Note that it is difficult for a conventional imaging lens to transmit far-infrared light, and therefore, the present technology is effective in a case where imaging of far-infrared light is performed, for example. Accordingly, a restored image may be an image of far-infrared light. Alternatively, a restored image is not necessarily an image of far-infrared light, but may be an image of some other visible light or invisible light.

Further, by applying machine learning such as deep learning, for example, it is also possible to perform image recognition and the like using a detection image before restoration, without a restored image. In this case, the present technology can also be used to increase the accuracy of image recognition using a detection image before restoration. In other words, the image quality of the detection image before restoration becomes higher.

<<3. Example Applications>>

The technology according to the present disclosure may be applied to various products. For example, the technology according to the present disclosure may be embodied as an apparatus mounted on any type of mobile structure, such as an automobile, an electrical vehicle, a hybrid electrical vehicle, a motorcycle, a bicycle, a personal mobility device, an airplane, a drone, a vessel, a robot, a construction machine, or an agricultural machine (a tractor).

Figure 25:
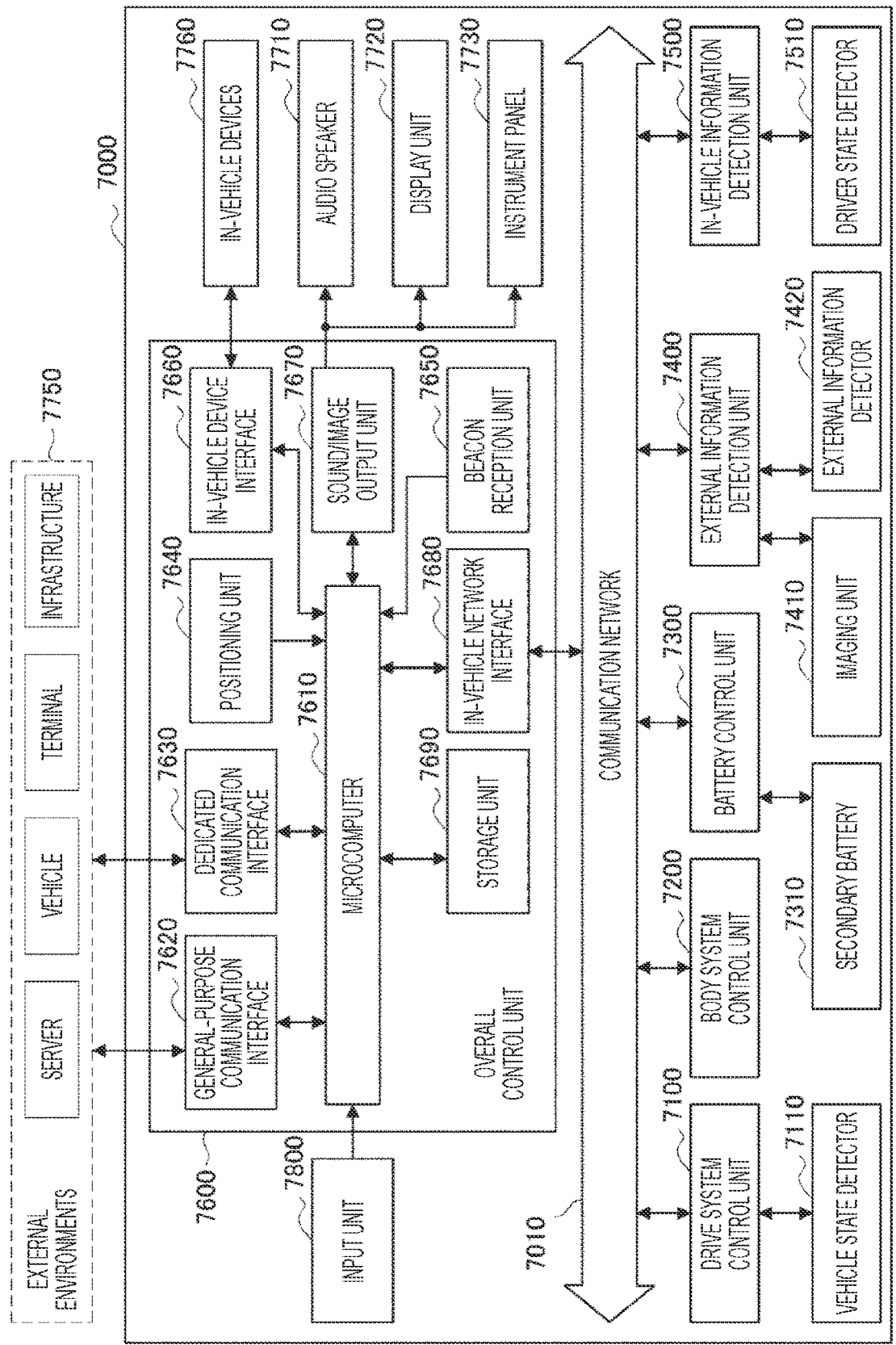
FIG. 25 is a block diagram schematically showing an example configuration of a vehicle control system.

FIG. 25 is a block diagram schematically showing an example configuration of a vehicle control system 7000 that is an example of a mobile structure control system to which the technology according to the present disclosure may be applied. The vehicle control system 7000 includes a plurality of electronic control units connected via a communication network 7010. In the example shown in FIG. 25, the vehicle control system 7000 includes a drive system control unit 7100, a body system control unit 7200, a battery control unit 7300, an external information detection unit 7400, an in-vehicle information detection unit 7500, and an overall control unit 7600. The communication network 7010 connecting the plurality of control units may be an in-vehicle communication network compliant with an appropriate standard, such as a controller area network (CAN), a local interconnect network (LIN), a local area network (LAN), or FlexRay (registered trademark), for example.

Each of the control units includes: a microcomputer that performs arithmetic processing according to various programs; a storage unit that stores the programs to be executed by the microcomputer, the parameters to be used for various calculations, or the like; and a drive circuit that drives the current device to be subjected to various kinds of control. Each of the control units includes a communication interface for performing communication through wired communication or wireless communication with an external device or a sensor or the like, as well as a network interface for communicating with another control unit via the communication network 7010. In FIG. 25, a microcomputer 7610, a general-purpose communication interface 7620, a dedicated communication interface 7630, a positioning unit 7640, a beacon reception unit 7650, an in-vehicle device interface 7660, a sound/image output unit 7670, an in-vehicle network interface 7680, and a storage unit 7690 are shown as the functional components of the overall control unit 7600. Likewise, the other control units each include a microcomputer, a communication interface, a storage unit, and the like.

The drive system control unit 7100 controls operations of the devices related to the drive system of the vehicle according to various programs. For example, the drive system control unit 7100 functions as control devices such as a driving force generation device for generating a driving force of the vehicle such as an internal combustion engine or a driving motor, a driving force transmission mechanism for transmitting the driving force to the wheels, a steering mechanism for adjusting the steering angle of the vehicle, and a braking device for generating a braking force of the vehicle. The drive system control unit 7100 may also have functions as a control device such as an antilock brake system (ABS) or an electronic stability control (ESC).

A vehicle state detector 7110 is connected to the drive system control unit 7100. For example, the vehicle state detector 7110 includes at least one of the following components: a gyroscope sensor that detects an angular velocity of axial rotation motion of the vehicle body; an acceleration sensor that detects an acceleration of the vehicle; and a sensor for detecting an operation amount of the gas pedal, an operation amount of the brake pedal, a steering angle of the steering wheel, an engine rotation speed, a wheel rotation speed, or the like. The drive system control unit 7100 performs arithmetic processing using a signal input from the vehicle state detector 7110, and controls the internal combustion engine, the driving motor, the electrical power steering device, the brake device, or the like.

The body system control unit 7200 controls operations of the various devices mounted on the vehicle body accord in to various programs. For example, the body system control unit 7200 functions as a keyless entry system, a smart key system, a power window device, or a control device for various lamps such as a headlight, a backup lamp, a brake lamp, a turn signal lamp, or a fog lamp. In this case, the body system control unit 7200 can receive radio waves transmitted from a portable device that substitutes for a key, or signals from various switches. The body system control unit 7200 receives inputs of these radio waves or signals, and controls the door lock device, the power window device, the lamps, and the like of the vehicle.

The battery control unit 7300 controls a secondary battery 7310 that is a power supply source for the driving motor, according to various programs. For example, the battery control unit 7300 receives information, such as a battery temperature, a battery output voltage, or a remaining capacity of the battery, from a battery device including the secondary battery 7310. The battery control unit 7300 performs arithmetic processing using these signals, to control temperature adjustment of the secondary battery 7310 or to control a cooling device or the like provided in the battery device.

The external information detection unit 7400 detects information outside the vehicle equipped with the vehicle control system 7000. For example, an imaging unit 7410 and/or an external information detector 7420 is connected to the external information detection unit 7400. The imaging unit 7410 includes at least one of the following cameras: a time-of-flight (ToF) camera, a stereo camera, a monocular camera, an infrared camera, or other cameras. The external information detector 7420 includes an environment sensor for detecting the current weather or meteorological phenomenon, and/or an ambient information detection sensor for detecting another vehicle, an obstacle, a pedestrian, or the like around the vehicle equipped with the vehicle control system 7000, for example.

The environment sensor may be formed with at least one of the following sensors: a raindrop sensor that detects rain, a fog sensor that detects a fog, a solar radiation sensor that detects a degree of solar radiation, or a snow sensor that detects a snowfall, for example. The ambient information detection sensor may be at least one of the following devices: an ultrasonic sensor, a radar device, or a light detection and ranging, laser imaging detection and ranging (LIDAR) device. The imaging unit 7410 and the external information detector 7420 may be provided as an independent device and an independent sensor, respectively, or may be provided as a device in which a plurality of sensors or devices is integrated.

Figure 26:
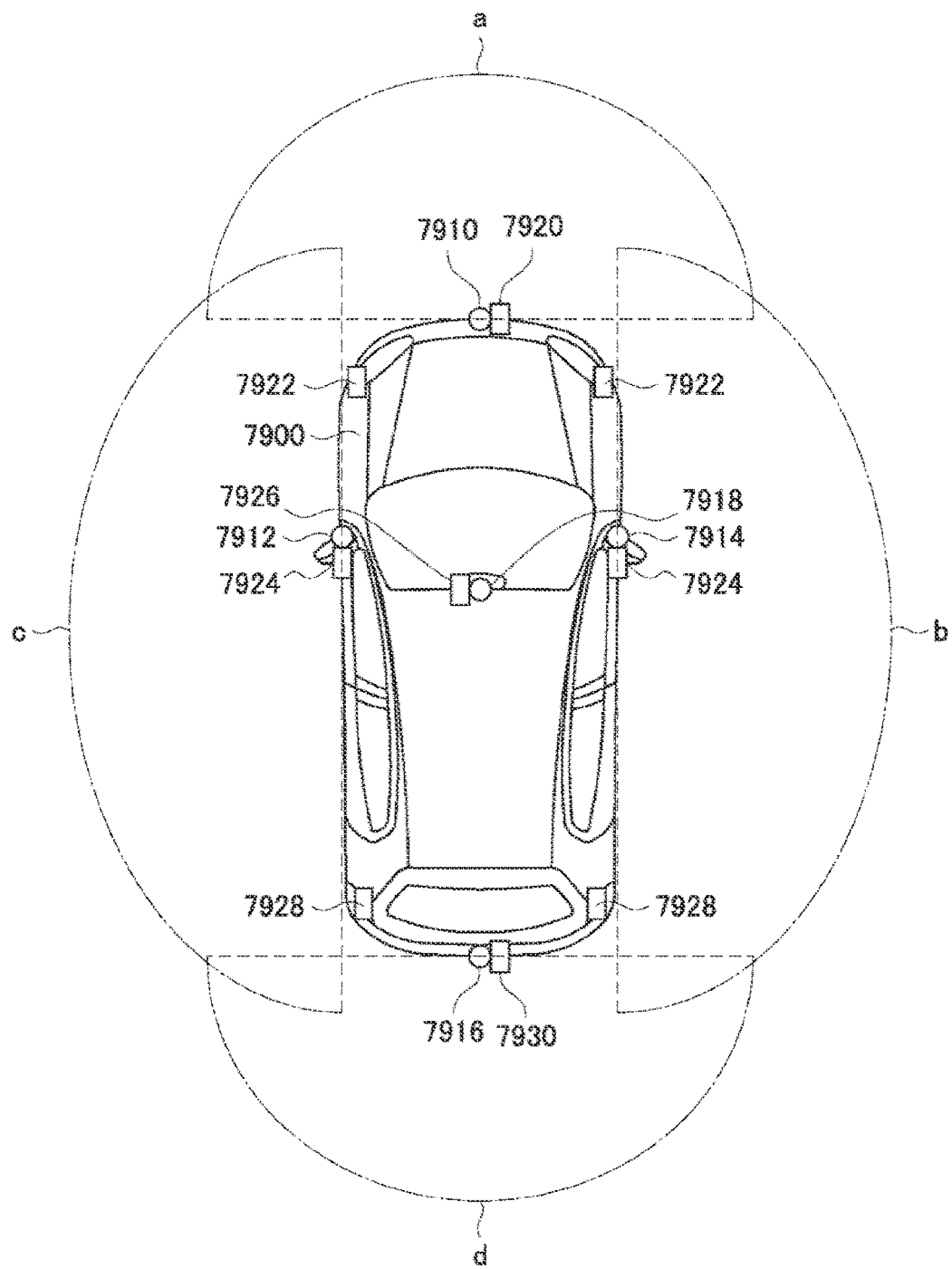
FIG. 26 is an explanatory diagram showing an example of installation positions of external information detectors and imaging units.

Here, FIG. 26 shows an example of installation positions of imaging units 7410 and external information detectors 7420. Imaging units 7910, 7912, 7914, 7916, and 7918 are provided at at least one of the following positions: the front end edge of a vehicle 7900, a side mirror, the rear bumper, a rear door, or an upper portion of the front windshield inside the vehicle, for example. The imaging unit 7910 provided on the front end edge and the imaging unit 7918 provided on the upper portion of the front windshield inside the vehicle mainly capture images ahead of the vehicle 7900. The imaging units 7912 and 7914 provided on the side mirrors mainly capture images on the sides of the vehicle 7900. The imaging unit 7916 provided on the rear bumper or a rear door mainly captures images behind the vehicle 7900. The imaging unit 7918 provided on the upper portion of the front windshield inside the vehicle is mainly used for detection of a vehicle running in front of the vehicle, a pedestrian, an obstacle, a traffic signal, a traffic sign, a lane, or the like.

Note that FIG. 26 shows an example of the imaging range of each of the imaging units 7910, 7912, 7914, and 7916. An imaging range a indicates the imaging range of the imaging unit 7910 provided on the front end edge, imaging ranges b and c indicate the imaging ranges of the imaging units 7912 and 7914 provided on the respective side mirrors, and an imaging range d indicates the imaging range of the imaging unit 7916 provided on the rear bumper or a rear door. For example, image data captured by the imaging units 7910, 7912, 7914, and 7916 are superimposed on one another, so that an overhead image of the vehicle 7900 viewed from above is obtained.

External information detectors 7920, 7922, 7924, 7926, 7928, and 7930 provided on the front, the rear, the sides, the corners of the vehicle 7900 and an upper portion of the front windshield inside the vehicle may be ultrasonic sensors or radar devices, for example. The external information detectors 7920, 7926, and 7930 provided on the front end edge of the vehicle 7900, the rear bumper, and the rear doors, and the upper portion of the front windshield inside the vehicle may be LIDAR devices, for example. These external information detectors 7920 through 7930 are mainly used for detecting a vehicle running in front of the vehicle 7900, a pedestrian, an obstacle, or the like.

Referring back to FIG. 25, the explanation is continued. The external information detection unit 7400 causes the imaging unit 7410 to capture an image of the outside of the vehicle, and receives the captured image data. The external information detection unit 7400 also receives detection information from the external information detector 7420 connected thereto. In a case where the external information detector 7420 is an ultrasonic sensor, a radar device, or a LIDAR device, the external information detection unit 7400 causes the external information detector 7420 to transmit ultrasonic waves, or electromagnetic waves, or the like, and receive information about received reflected waves. On the basis of the received information, the external information detection unit 7400 may perform an object detection process for detecting a person, a vehicle, an obstacle, a sign, characters on the road surface, or the like, or perform a distance detection process. On the basis of the received information, the external information detection unit 7400 may also perform an environment recognition process for recognizing a rainfall, a fog, a road surface condition, or the like. On the basis of the received information, the external information detection unit 7400 may also calculate the distance to an object outside the vehicle.

Further, on the basis of the received image data, the external information detection unit 7400 may perform an image recognition process for recognizing a person, a vehicle, an obstacle, a sign, characters on the road surface, or the like, or a distance detection process. The external information detection unit 7400 may also perform processing such as distortion correction or positioning on the received image data, and combine the image data captured by different imaging units 7410, to generate an overhead image or a panoramic image. The external information detection unit 7400 may also perform a viewpoint conversion process using image data captured by different imaging units 7410.

The in-vehicle information detection unit 7500 detects information about the inside of the vehicle. For example, a driver state detector 7510 that detects the state of the driver is connected to the in-vehicle information detection unit 7500. The driver state detector 7510 may include a camera that captures images of the driver, a biometric sensor that detects biological information about the driver, a microphone that collects sounds inside the vehicle, or the like. The biometric sensor is provided on the seating surface or the steering wheel or the like, for example, and detects biological information about a passenger sitting on a seat or the driver holding the steering wheel. On the basis of the detection information input from the driver state detector 7510, the in-vehicle information detection unit 7500 may calculate the degree of fatigue or the degree of concentration of the driver, or determine whether the driver is dozing off. The in-vehicle information detection unit 7500 may also perform a noise cancel process or the like on the collected sound signals.

The overall control unit 7600 controls the entire operation in the vehicle control system 7000 according to various programs. An input unit 7800 is connected to the overall control unit 7600. The input unit 7800 is formed with a device on which a passenger can perform an input operation, such as a touch panel, buttons, a microphone, a switch, or a lever, for example. The overall control unit 7600 may receive data obtained by performing speech recognition on sound input through a microphone. For example, the input unit 7800 may be a remote control device using infrared rays or some other radio waves, or an external connection device such as a portable telephone or a personal digital assistant (PDA) compatible with operations on the vehicle control system 7000. The input unit 7800 may be a camera, for example, and in that case, a passenger can input information by gesture. Alternatively, data obtained by detecting movement of a wearable device worn by a passenger may be input. Further, the input unit 7800 may include an input control circuit or the like that generates an input signal on the basis of information input by a passenger or the like using the above input unit 7800, for example, and outputs the input signal to the overall control unit 7600. By operating this input unit 7800, a passenger or the like inputs various data to the vehicle control system 7000 or issues a processing operation instruction to the vehicle control system 7000.

The storage unit 7690 may include a read only memory (ROM) that stores various programs to be executed by the microcomputer, and a random access memory (RAM) that stores various parameters, calculation results, sensor values, and the like. Also, the storage unit 7690 may be formed with a magnetic storage device such as a hard disc drive (HDD), a semiconductor storage device, an optical storage device, a magneto-optical storage device, or the like.

The general-purpose communication interface 7620 is a general communication interface that mediates communication with various devices existing in external environments 7750. The general-purpose communication interface 7620 may implement a cellular communication protocol such as global system of mobile communications (GSM) (registered trademark), WiMAX (registered trademark), long term evolution (LTE (registered trademark)), or LTE-Advanced (LTE-A), or some other wireless communication protocol such as wireless LAN (also called Wi-Fi (registered trademark)) or Bluetooth (registered trademark). The general-purpose communication interface 7620 may be connected to a device (an application server or a control server, for example) existing in an external network (the Internet, a cloud network, or a company-specific network, for example) via a base station or an access point, for example. Alternatively, the general-purpose communication interface 7620 may be connected to a terminal (a terminal of a driver, a pedestrian, or a shop, or a machine type communication (MTC) terminal, for example) existing in the vicinity of the vehicle, using the peer-to-peer (P2P) technology, for example.

The dedicated communication interface 7630 is a communication interface that supports a communication protocol formulated for use in a vehicle. The dedicated communication interface 7630 may implement a standard protocol such as Wireless Access in Vehicle Environment (WAVE), which is a combination of IEEE802.11p as the lower layer and IEEE1609 as the upper layer, Dedicated Short Range Communications (DSRC), or a cellular communication protocol, for example. Typically, the dedicated communication interface 7630 conducts V2X communication, which is a concept including at least one of the following kinds of communication: vehicle-to-vehicle communication, vehicle-to-infrastructure communication, vehicle-to-home communication, and vehicle-to-pedestrian communication.

The positioning unit 7640 receives a GNSS signal (a. GPS signal from a global positioning system (GPS) satellite, for example) from a global navigation satellite system (GNSS) satellite, performs positioning, and generates location information including the latitude, the longitude, and the altitude of the vehicle, for example. Note that the positioning unit 7640 may identify the current location by exchanging signals with a wireless access point, or may acquire the location information from a terminal having a positioning function, such as a portable telephone, a PHS, or a smartphone.

The beacon reception unit 7650 receives radio waves or electromagnetic waves transmitted from a wireless station or the like installed on a road, for example, and acquires information about the current location, traffic congestion, closing of a road, a required time, or the like. Note that the functions of the beacon reception unit 7650 may be included in the dedicated communication interface 7630 described above.

The in-vehicle device interface 7660 is a communication interface that mediates connection between the microcomputer 7610 and various in-vehicle devices 7760 existing in the vehicle. The in-vehicle device interface 7660 may establish a wireless connection, using a wireless communication protocol such as wireless LAN, Bluetooth (registered trademark), Near Field Communication (NFC), or wireless USB (WUSB). Further, the in-vehicle device interface 7660 may establish a wired connection to a universal serial bus (USB), a high-definition multimedia interface (HDMI (registered trademark)), a mobile high-definition link (MHL), or the like via a connecting terminal (not shown) (and a cable, if necessary). The in-vehicle devices 7760 may include a mobile device or a wearable device owned by a passenger, and/or an information device installed in or attached to the vehicle, for example. The in-vehicle devices 7760 may also include a navigation device that searches for a route to a desired destination. The in-vehicle device interface 7660 exchanges control signals or data signals with these in-vehicle devices 7760.

The in-vehicle network interface 7680 is an interface that mediates communication between the microcomputer 7610 and the communication network 7010. The in-vehicle network interface 7680 transmits and receives signals and the like, according to a predetermined protocol supported by the communication network 7010.

The microcomputer 7610 of the overall control unit 7600 controls the vehicle control system 7000 according to various programs, following information acquired via at least one of the following components: the general-purpose communication interface 7620, the dedicated communication interface 7630, the positioning unit 7640, the beacon reception unit 7650, the in-vehicle device interface 7660, and the in-vehicle network interface 7680. For example, on the basis of acquired external and internal information, the microcomputer 7610 may calculate the control target value of the driving force generation device, the steering mechanism, or the braking device, and output a control command to the drive system control unit 7100. For example, the microcomputer 7610 may perform cooperative control to achieve the functions of an advanced driver assistance system (ADAS), including vehicle collision avoidance or impact mitigation, follow-up running based on the distance between vehicles, vehicle speed maintenance running, vehicle collision warning, vehicle lane deviation warning, or the like. The microcomputer 7610 may also perform cooperative control to conduct automated driving or the like for autonomously running not depending on the operation of the driver, by controlling the driving force generation device, the steering mechanism, the braking device, or the like on the basis of acquired information about the surroundings of the vehicle.

The microcomputer 7610 may generate information about the three-dimensional distance between the vehicle and an object such as a nearby architectural structure or a person, and create local map information including surroundings information about the current location of the vehicle, on the basis of information acquired via at least one of the following components: the general-purpose communication interface 7620, the dedicated communication interface 7630, the positioning unit 7640, the beacon reception unit 7650, the in-vehicle device interface 7660, and the in-vehicle network interface 7680. The microcomputer 7610 may also generate a warning signal by predicting danger such as a collision of the vehicle, an approach of a pedestrian or the like, or entry to a closed road, on the basis of acquired information. The warning signal may be a signal for generating an alarm sound or for turning on a warning lamp, for example.

The sound/image output unit 7670 transmits an audio output signal and/or an image output signal to an output device that is capable of visually or audibly notifying the passenger(s) of the vehicle or the outside of the vehicle of information. In the example shown in FIG. 25, an audio speaker 7710, a display unit 7720, and an instrument panel 7730 are shown as output devices. The display unit 7720 may include an on-board display and/or a head-up display, for example. The display unit 7720 may have an augmented reality (AR) display function. An output device may be some device other than the above devices, such as a wearable device like a headphone or an eyeglass-type display to be worn by a passenger, a projector, or a lamp. In a case where the output device is a display device, the display device visually displays results obtained through various processes performed by the microcomputer 7610, or information received from other control units, in various forms such as text, an image, a table, or a graph. Further, in a case where the output device is a sound output device, the sound output device converts an audio signal formed with reproduced sound data, acoustic data, or the like into an analog signal, and audibly outputs the analog signal.

Note that, in the example shown in FIG. 25, at least two control units connected via the communication network 7010 may be integrated into one control unit Alternatively, each control unit may be formed with a plurality of control units. Further, the vehicle control system 7000 may include another control unit that is not shown in the drawing. Also, in the above description, some or all of the functions of one of the control units may be provided by some other control unit. That is, as long as information is transmitted and received via the communication network 7010, predetermined arithmetic processing may be performed by any control unit. Likewise, a sensor or a device connected to any control unit may be connected to another control unit, and a plurality of control units may transmit and receive detection information to and from one another via the communication network 7010.

In the vehicle control system 7000 described above, the imaging apparatus 101 according to this embodiment described with reference to FIG. 1 can be applied to the imaging unit 7410 of the example application shown in FIG. 25, for example. With this arrangement, a restored image from which flicker has been removed is supplied from the imaging unit 7410 to the external information detection unit 7400, and the detection accuracy of the external information detection unit 7400 is increased for a traffic light, an electronic guide board, an electronic sign, a street lamp, or the like that causes flicker.

<<4. Other Aspects>>

The series of processes described above can be performed by hardware, and can also be performed by software. In a case where the series of processes are to be performed by software, the program that forms the software is installed into a computer. Here, the computer may be a computer (such as the control unit 123, for example) incorporated in dedicated hardware.

The program to be executed by the computer may be recorded on a recording medium as a packaged medium or the like (such as the recording medium 130), for example, and be then provided. Alternatively, the program can be provided via a wired or wireless transmission medium, such as a local area network, the Internet, or digital satellite broadcasting.

Note that the program to be executed by the computer may be a program for performing processes in chronological order in accordance with the sequence described in this specification, or may be a program for performing processes in parallel or performing a process when necessary, such as when there is a call.

Further, embodiments of the present technology are not limited to the above described embodiments, and various modifications may be made to them without departing from the scope of the present technology.

For example, the present technology may be embodied in a cloud computing configuration in which one function is shared among a plurality of devices via a network, and processing is performed by the devices cooperating with one another.

Further, the respective steps described with reference to the flowcharts described above may be carried out by one device or may be shared among a plurality of devices.

Furthermore, in a case where a plurality of processes is included in one step, the plurality of processes included in the one step may be performed by one device or may be shared among a plurality of devices.

Note that the present technology may also be embodied in the configurations described below.

(1)

An imaging device including:

a pixel region in which a plurality of pixels including a pixel that receives incident light and outputs one detection signal indicating an output pixel value modulated depending on an incident angle of the incident light is arranged in a row direction and a column direction, and is sequentially exposed row by row, the incident light entering from an object via neither an imaging lens nor a pinhole; and a plurality of detection regions that are disposed in different rows in the pixel region, and are used for flicker detection.

(2)

The imaging device according to (1), in which the respective detection regions have substantially the same incident angle directivity indicating a directivity with respect to the incident angle of the incident light.

(3)

The imaging device according to (2), in which the arrangement of the pixels is substantially the same in the respective detection regions, and the incident angle directivities of the pixels at the same positions in the respective detection regions are substantially the same.

(4)

The imaging device according to any one of (1) to (3), in which a restored image is restored for each of the detection regions.

(5)

The imaging device according to any one of (1) to (3), in which the detection regions are different from a region to be used to restore a restored image in the pixel region.

(6)

A signal processing device including a flicker detection unit that performs flicker detection on the basis of at least one of a plurality of detection images or a plurality of restored images restored from the respective detection images, the plurality of detection images being generated for a plurality of detection regions on the basis of detection signals output from pixels in the plurality of detection regions disposed in different rows in a pixel region that is sequentially exposed row by row, a plurality of pixels being arranged in a row direction and a column direction in the pixel region, the plurality of pixels including a pixel that receives incident light and outputs one detection signal indicating as output pixel value modulated depending on an incident angle of the incident light, the incident light entering from an object via neither an imaging lens nor a pinhole.

(7)

The signal processing device according to (6), in which the flicker detection unit detects flicker, on the basis of a difference in luminance between the respective detection images.

(8)

The signal processing device according to (7), further including a restoration unit that restores the restored image from the detection image selected on the basis of the luminances of the respective detection images when flicker is detected by the flicker detection unit.

(9)

The signal processing device according to (8), in which the restoration unit restores the restored image from one detection image of the plurality of detection images when no flicker is detected by the flicker detection unit.

(10)

The signal processing device according to (6), further including a restoration unit that restores the restored image from each of the detection images, in which the flicker detection unit detects flicker on the basis of a difference in luminance between the respective restoration images.

(11)

The signal processing device according to (10), in which the flicker detection unit detects a flicker region presumed to have the flicker, on the basis of a difference in luminance of each pixel between the respective restored images.

(12)

The signal processing device according to (11), in which the restoration unit adds up images of regions other than the flicker regions or the respective restored images, and combines a result with an image of the flicker region selected from among the flicker regions of the respective restored images on the basis of luminances of the flicker regions.

(13)

The signal processing device according to (12), further including a moving object detection unit that detects a moving object in the restored image subjected to the adding and the combining by the restoration unit, on the basis of feature points of the respective restored images.

(14)

The signal processing device according to any one of (6) to (13), in which the respective detection regions have substantially the same incident angle directivity indicating a directivity with respect to the incident angle of the incident light.

(15)

A signal processing method including performing flicker detection on the basis of at least one of a plurality of detection images or a plurality of restored images restored from the respective detection images, the plurality of detection images being generated for a plurality of detection regions on the basis of detection signals output from pixels in the plurality of detection regions disposed in different rows in a pixel region that is sequentially exposed row by row, a plurality of pixels being arranged in a row direction and a column direction in the pixel region, the plurality of pixels including a pixel that receives incident light and outputs one detection signal indicating an output pixel value modulated depending on an incident angle of the incident light, the incident light entering from an object via neither an imaging lens nor a pinhole.

(16)

A program for causing a computer to perform a process including performing flicker detection on the basis of at least one of a plurality of detection images or a plurality of restored images restored from the respective detection images, the plurality of detection images being generated for a plurality of detection regions on the basis of detection signals output from pixels in the plurality of detection regions disposed in different rows in a pixel region that is sequentially exposed row by row, a plurality of pixels being arranged in a row direction and a column direction in the pixel region, the plurality of pixels including a pixel that receives incident light and outputs one detection signal indicating an output pixel value modulated depending on an incident angle of the incident light, the incident light entering from an object via neither an imaging lens nor a pinhole.

(17) An imaging apparatus including:
an imaging device that includes:
a pixel region that is sequentially exposed row by row, a plurality of pixels being arranged in a row direction and a column direction in the pixel region, the plurality of pixels including a pixel that receives incident light and outputs one detection signal indicating an output pixel value modulated depending on an incident angle of the incident light, the incident light entering from an object via neither an imaging lens nor a pinhole; and
a plurality of detection regions that are disposed in different rows in the pixel region, and are used for flicker detection; and
a flicker detection unit that performs flicker detection on the basis of at least one of a plurality of detection images or a plurality of restored images restored from the respective detection images, the plurality of detection images being generated for the plurality of detection regions on the basis of detection signals output from the pixels in the respective detection regions.

(18) The imaging apparatus according to (17), in which
the respective detection regions have substantially the same incident angle directivity indicating a directivity with respect to the incident angle of the incident light.

Note that the advantageous effects described is this specification are merely examples, and the advantageous effects of the present technology are not limited to them and may include other effects.

REFERENCE SIGNS LIST

101 Imaging apparatus
111 Signal processing control unit
121 Imaging device
121a, 121a' Pixel
121aA Pixel for restoration
121aB Pixel for exposure
121b Light shielding film
122 Restoration unit
123 Control unit
201 Pixel region
202A to 202C Detect ion region
221 Flicker detection unit
222 Moving object detection unit
301A to 301C, 303 Restored image

The invention claimed is:

1. An imaging device comprising:
a pixel region in which a plurality of pixels including a pixel that receives incident light and outputs one detection signal indicating an output pixel value modulated depending on an incident angle of the incident light is arranged in a row direction and a column direction, and is sequentially exposed row by row, the incident light entering from an object via neither an imaging lens nor a pinhole; and
a plurality of detection regions that are disposed in different rows in the pixel region, and are used for flicker detection.

2. The imaging device according to claim 1, wherein
the respective detection regions have substantially the same incident angle directivity indicating a directivity with respect to the incident angle of the incident light.

3. The imaging device according to claim 2, wherein
arrangement of the pixels is substantially the same in the respective detection regions, and the incident angle directivities of the pixels at the same positions in the respective detection regions are substantially the same.

4. The imaging device according to claim 1, wherein
a restored image is restored for each of the detection regions.

5. The imaging device according to claim 1, wherein
the detection regions are different from a region to be used to restore a restored image in the pixel region.

6. A signal processing device comprising:
a flicker detection unit that performs flicker detection on a basis of at least one of a plurality of detection images or a plurality of restored images restored from the respective detection images, the plurality of detection images being generated for a plurality of detection regions on a basis of detection signals output from pixels in the plurality of detection regions disposed in different rows a pixel region that is sequentially exposed row by row,
a plurality of pixels being arranged in a row direction and a column direction in the pixel region,
the plurality of pixels including a pixel that receives incident light and outputs one detection signal indicating an output pixel value modulated depending on an incident angle of the incident light, the incident light entering from an object via neither an imaging lens nor a pinhole.

7. The signal processing device according to claim 6, wherein
the flicker detection unit detects flicker, on a basis of a difference in luminance between the respective detection images.

8. The signal processing device according to claim 7, further comprising
a restoration unit that restores the restored image from the detection image selected on a basis of the luminances of the respective detection images when flicker is detected by the flicker detection unit.

9. The signal processing device according to claim 8, wherein
the restoration unit restores the restored image from one detection image of the plurality of detection images when no flicker is detected by the flicker detection unit.

10. The signal processing device according to claim 6, further comprising
a restoration unit that restores the restored image from each of the detection images,
wherein the flicker detection unit detects flicker on a basis of a difference in luminance between the respective restoration images.

11. The signal processing device according to claim 10, wherein
the flicker detection unit detects a flicker region presumed to have the flicker, on a basis of a difference in luminance of each pixel between the respective restored images.

12. The signal processing device according to claim 11, wherein
the restoration unit adds up images of regions other than the flicker regions of the respective restored images, and combines a result with an image of the flicker region selected from among the flicker regions of the respective restored images on a basis of luminances of the flicker regions.

13. The signal processing device according to claim 12, further comprising
  a moving object detection unit that detects a moving object in the restored image subjected to the adding and the combining by the restoration unit, on a basis of feature points of the respective restored images.

14. The signal processing device according to claim 6, wherein
  the respective detection regions have substantially the same incident angle directivity indicating a directivity with respect to the incident angle of the incident light.

15. A signal processing method comprising:
  performing flicker detection on a basis of at least one of a plurality of detection images or a plurality of restored images restored from the respective detection images, the plurality of detection images being generated for a plurality of detection regions on a basis of detection signals output from pixels the plurality of detection regions disposed in different rows in a pixel region that is sequentially exposed row by row,
  a plurality of pixels being arranged in a row direction and a column direction in the pixel region,
  the plurality of pixels including a pixel that receives incident light and outputs one detection signal indicating an output pixel value modulated depending on an incident angle of the incident light, the incident light entering from an object via neither an imaging lens nor a pinhole.

16. A non-transitory computer readable medium storing a program, the program being executable by a processor to perform operations comprising:
  performing flicker detection on a basis of at least one of a plurality of detection images or a plurality of restored images restored from the respective detection images, the plurality of detection images being generated for a plurality of detection regions on a basis of detection signals output from pixels in the plurality of detection regions disposed in different rows in a pixel region that is sequentially exposed row by row,
  a plurality of pixels being arranged in a row direction and a column direction in the pixel region,
  the plurality of pixels including a pixel that receives incident light and outputs one detection signal indicating an output pixel value modulated depending on an incident angle of the incident light, the incident light entering from an object via neither an imaging lens nor a pinhole.

17. An imaging apparatus comprising:
  an imaging device that includes:
    a pixel region that is sequentially exposed row by row, a plurality of pixels being arranged in a row direction and a column direction in the pixel region, the plurality of pixels including a pixel that receives incident light and outputs one detection signal indicating an output pixel value modulated depending on an incident angle of the incident light, the incident light entering from an object via neither an imaging lens nor a pinhole; and
    a plurality of detection regions that are disposed in different rows in the pixel region, and are used for flicker detection; and
  a flicker detection unit that performs flicker detection on a basis of at least one of a plurality of detection images or a plurality of restored images restored from the respective detection images, the plurality of detection images being generated for the plurality of detection regions on a basis of detection signals output from the pixels fa the respective detection regions.

18. The imaging apparatus according to claim 17, wherein
  the respective detection regions have substantially the same incident angle directivity indicating a directivity with respect to the incident angle of the incident light.

\* \* \* \* \*